United States Patent [19]
Williams

[11] Patent Number: 5,744,994
[45] Date of Patent: Apr. 28, 1998

[54] THREE-TERMINAL POWER MOSFET SWITCH FOR USE AS SYNCHRONOUS RECTIFIER OR VOLTAGE CLAMP

[75] Inventor: Richard K. Williams, Cupertino, Calif.

[73] Assignee: Siliconix incorporated, Santa Clara, Calif.

[21] Appl. No.: 648,266

[22] Filed: May 15, 1996

[51] Int. Cl.$^6$ ................................................ H03K 17/687
[52] U.S. Cl. .......................... 327/374; 327/427; 327/581
[58] Field of Search .................................... 327/110, 374, 327/375, 376, 377, 574, 581, 583, 584, 585, 427, 434

[56] References Cited

U.S. PATENT DOCUMENTS 4,667,144  5/1987  Jones et al. .............................. 327/110

Primary Examiner—Timothy P. Callahan
Assistant Examiner—Jeffrey Zweizig
Attorney, Agent, or Firm—Skjerven, Morrill, MacPherson, Franklin & Friel; David E. Steuber

[57] ABSTRACT

An N-channel power MOSFET is fabricated with its source and body connected together and biased at a positive voltage with respect to its drain. The gate is controlled by a switch which alternately connects the gate to the source or to a voltage which turns the channel of the MOSFET fully on. When the gate is connected to the source, the device functions as a "pseudo-Schottky" diode which turns on at a lower voltage and provides a lower-resistance path than a conventional PN diode. When the gate is connected to the positive voltage the channel of the MOSFET is turned fully on. This MOSFET switch is particularly suitable for use as a synchronous rectifier in a power converter where it reduces the power loss and stored charge in the "break before make" interval (i.e., the interval between the turn-off of the shunt switch and the turn-on of the synchronous rectifier).

8 Claims, 32 Drawing Sheets

OFF CONDITION

THRESHOLD
CONNECTED

DIODE CONNECTED

PSEUDO-SCHOTTKY

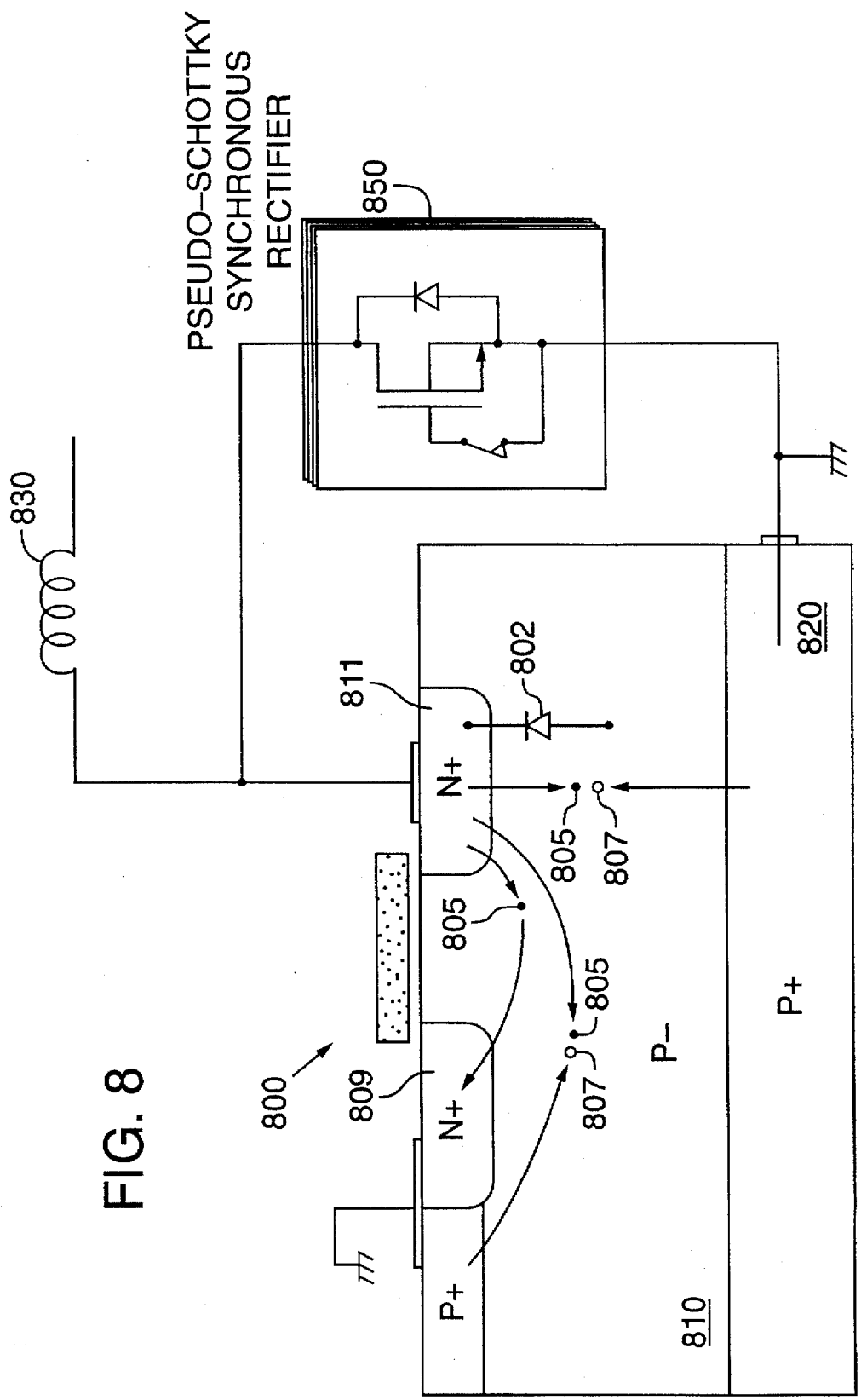

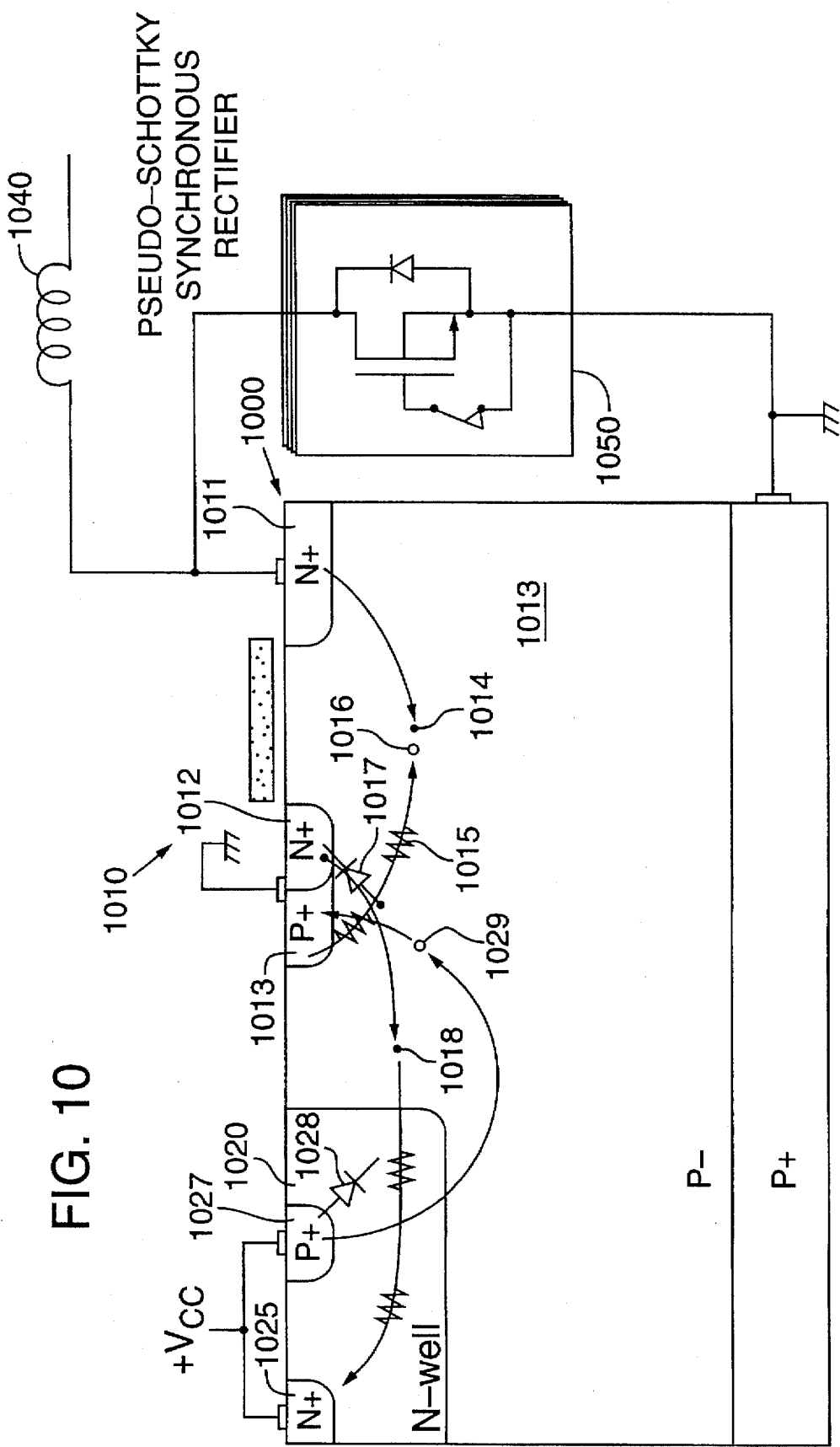

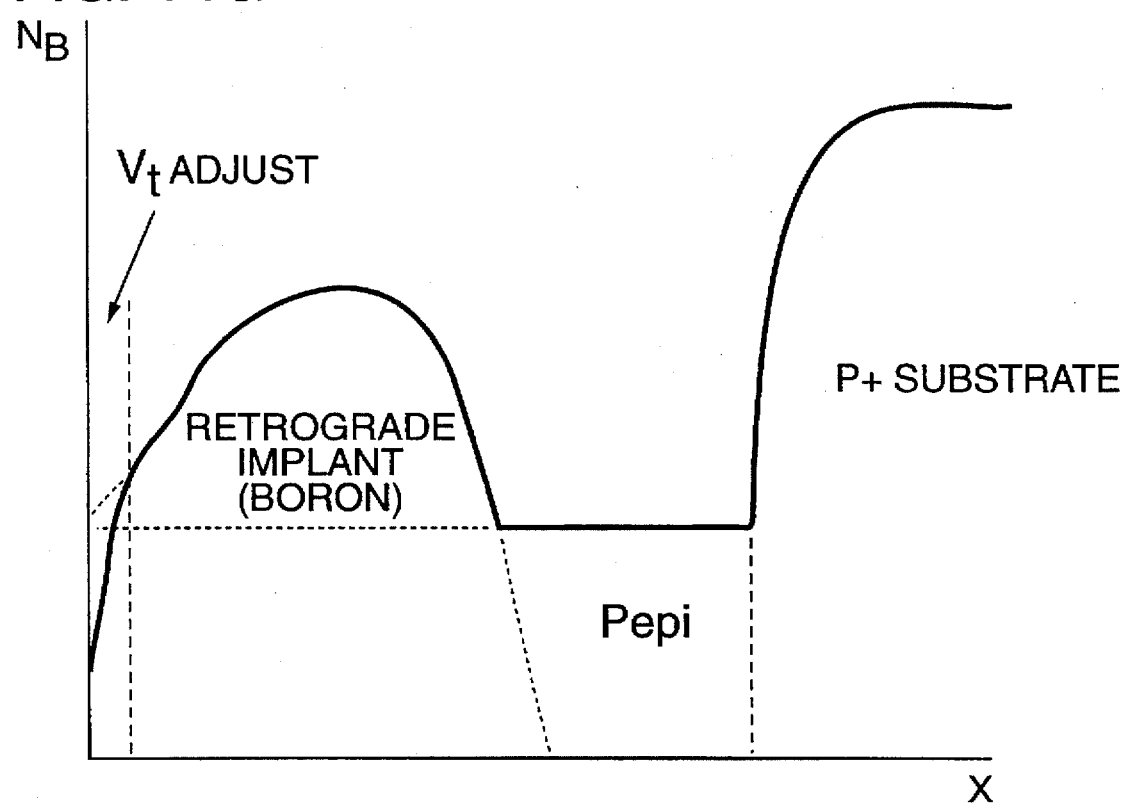

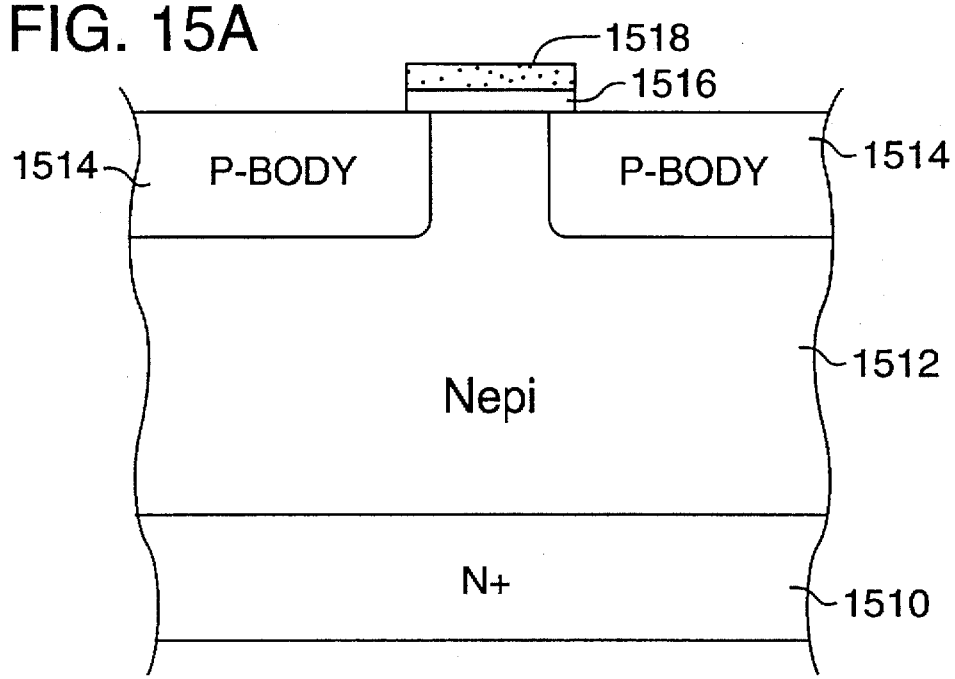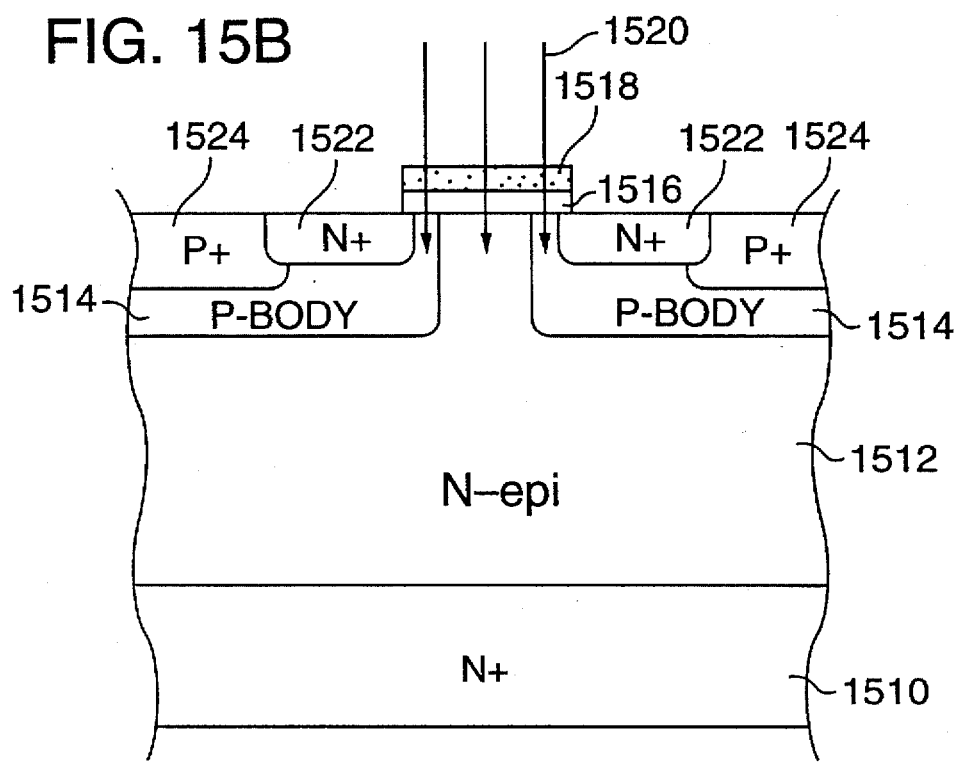

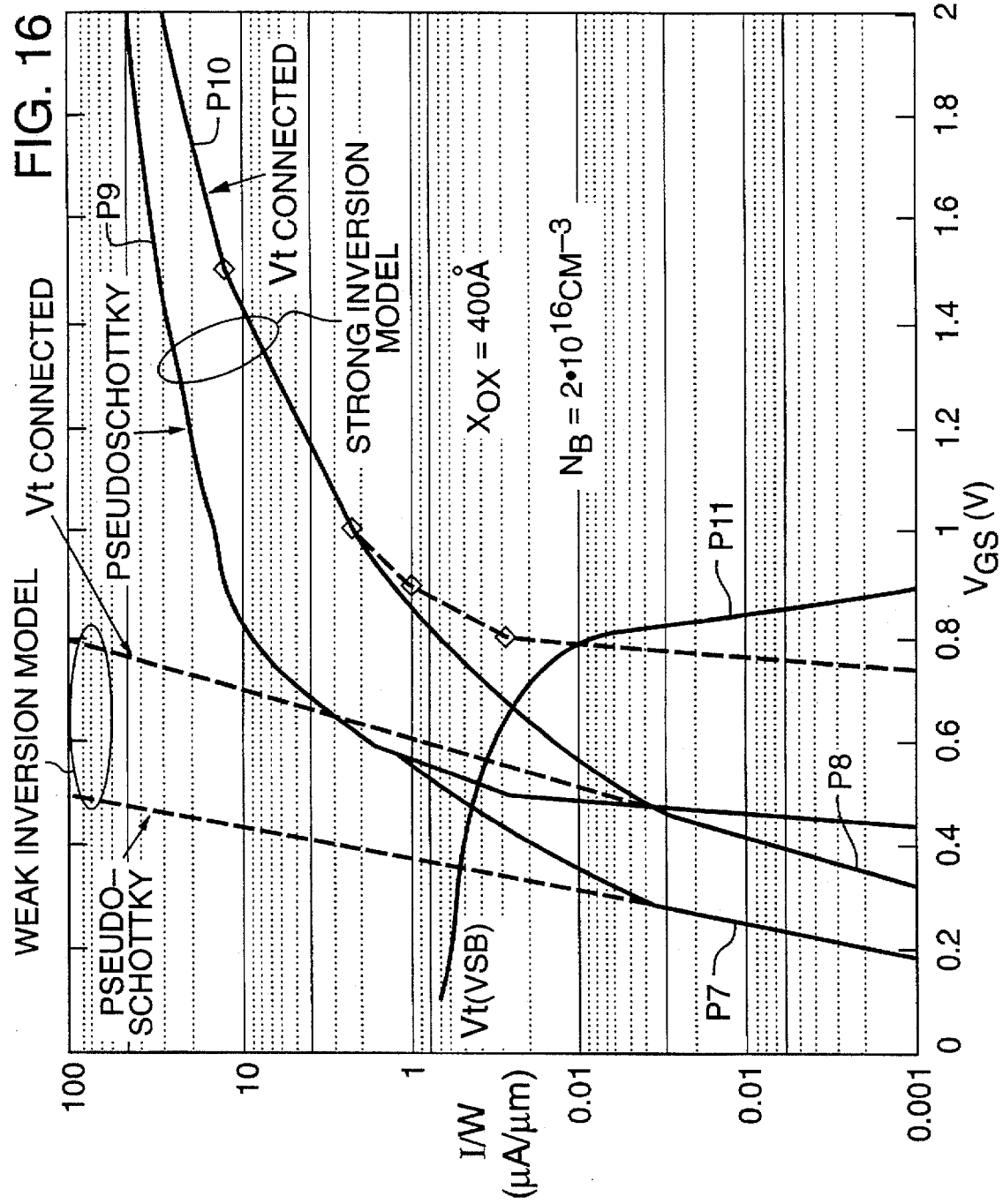

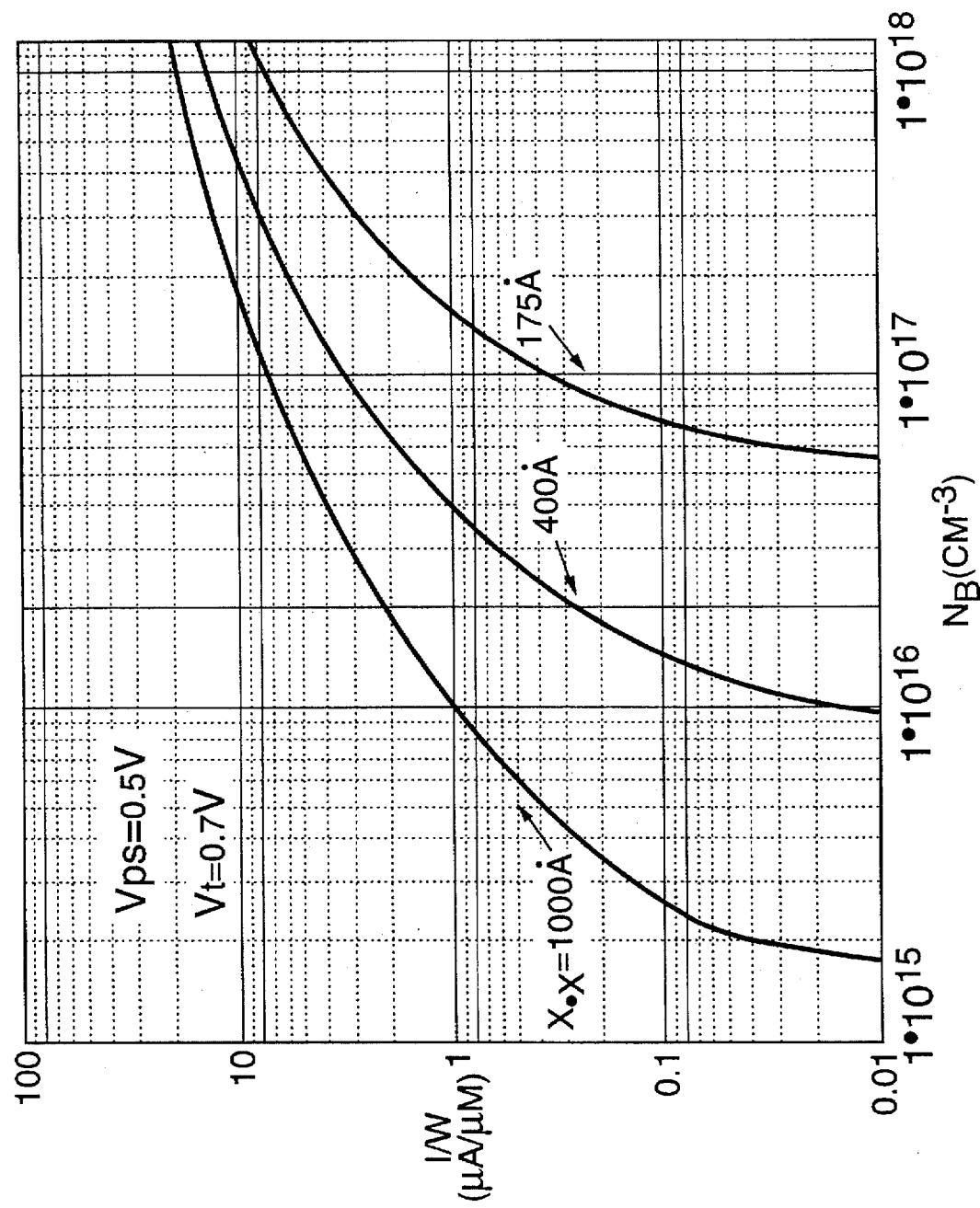

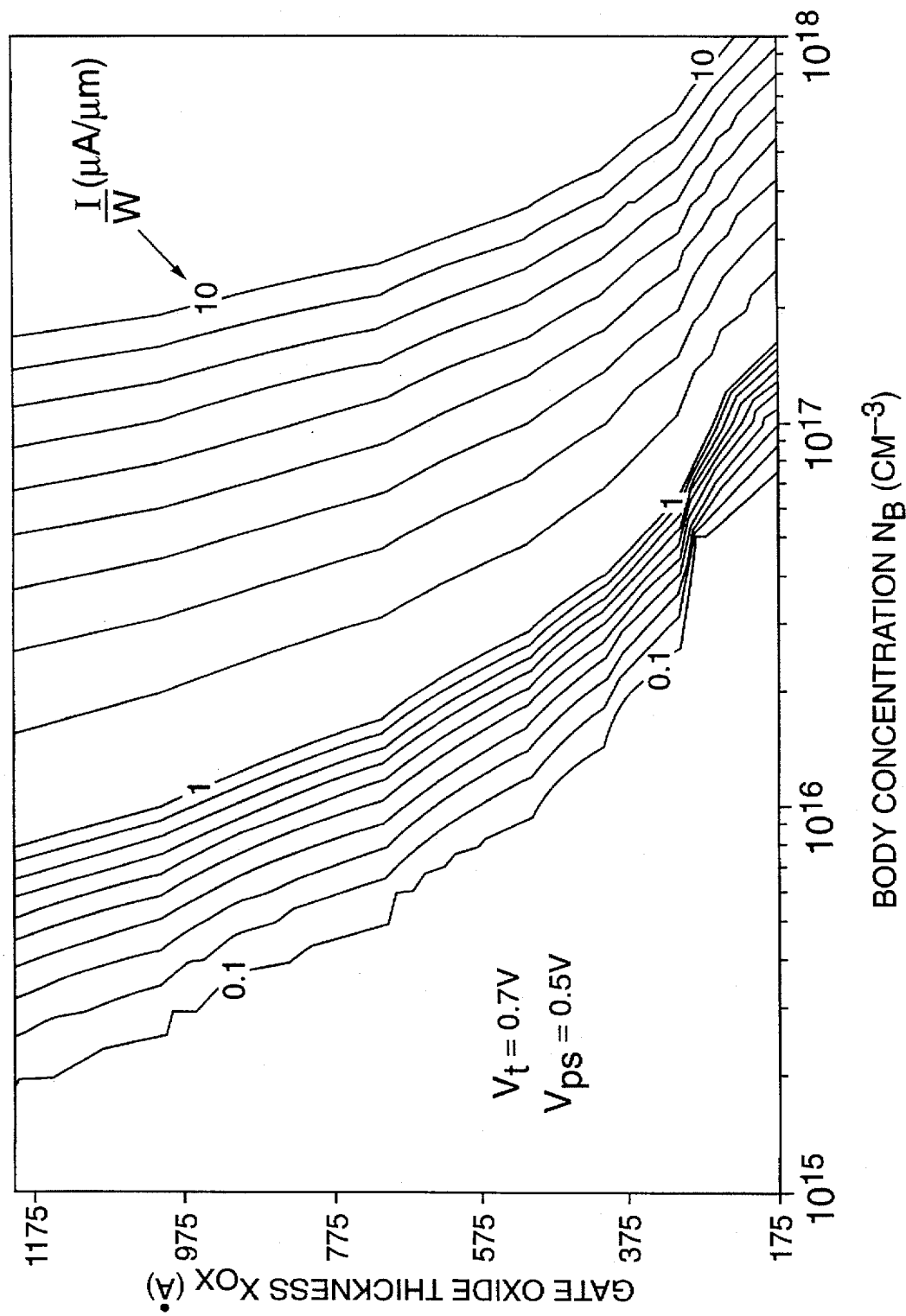

THREE-TERMINAL POWER MOSFET SWITCH FOR USE AS SYNCHRONOUS RECTIFIER OR VOLTAGE CLAMP

CROSS REFERENCE TO RELATED APPLICATIONS

This application is related to application Ser. No. 08/648,334 and application Ser. No. 08/649,774, each of which is being filed concurrently herewith and is incorporated herein by reference in its entirety.

FIELD OF THE INVENTION

This invention relates to power MOSFET switches for use as a synchronous rectifiers or voltage clamps in power converters and other circuits.

BACKGROUND OF THE INVENTION

Semiconductor devices are frequently used to switch currents in power electronic circuits. These devices normally contain PN junctions or diodes which can be driven into forward conduction or into avalanche breakdown by any voltage spikes which occur in the circuit. One common type of switching device, for example, is the power MOSFET, which has been discussed extensively in the literature since about 1980. Any MOSFET which has a normal source-body short contains a parasitic PN diode at the junction between its drain and body regions. The parasitic diode is often referred to as an "anti-parallel" diode since it is parallel to the current path through the channel of the MOSFET but is oriented such that it is normally reverse-biased.

The anti-parallel diode in a power MOSFET can become forward-biased in several ways. For example, an electrostatic discharge (ESD) in the circuit may cause this to happen. Moreover, in numerous power electronic circuits, an inductance in a path of large current flow produces rapid changes in voltage across its terminals as the inductance attempts to resist any changes in the magnitude of the current flowing through it. The well-known equation $V_L = L \, dI/dt$ describes this phenomenon and indicates that decreasing the current in an inductor, or opening a switch in series with an inductor, produces a negative value of $V_L$, i.e., a reversal in the polarity of the voltage across its terminals. If the magnitude of the reversed voltage exceeds the supply voltage, any number of circuit connections (customarily referred to as "nodes" in circuit theory) can reach potentials which are outside the range of the power supply voltage. In these instances, the anti-parallel PN diode in the MOSFET switch can become temporarily forward-biased.

In a motor driver, for example, shutting off a MOSFET that is connected in series with any of the motor windings will cause inductive flyback. In a push-push (i.e., halfbridge) driver, two switches are stacked one over the other between the supply rails, with the centerpoint between the switches connected to the motor. Generally, the high-side switch is turned on when the low-side switch is turned off, and vice-versa. In reality, however, the MOSFETs cannot be switched simultaneously because of the risk of overlapping on-states, which would produce a catastrophic current "shoot through" between the supply rails. Therefore, it is customary to provide a short "break-before-make" interval between the turn-off of one switch and the turn-on of the other switch, often referred by as a tri-state. Thus, following the turn-off of the low-side switch (with the high-side switch still turned off) the motor winding will drive the output (centerpoint) to a voltage above the positive rail and forward-bias the anti-parallel diode in the high-side MOSFET; and conversely, following the turn-off of the high-side switch (with the low-side switch still turned off) the motor winding will drive the output to a voltage below ground and forward-bias the anti-parallel diode in the low-side MOSFET. In other words, during the tri-state the inductive load will necessarily forward-bias one of the two anti-parallel diodes in the halfbridge. Conduction in the anti-parallel diodes is unavoidable.

In other circuits, such as those used in switching-mode DC-DC convertors and other power supplies, the anti-parallel diodes in the switching MOSFETs are intentionally made to conduct. In these circuits, the MOSFET is connected directionally in the manner of a rectifier so as to allow its parasitic diode to conduct whenever the "switch" of the converter is opened. The gate of the MOSFET is synchronized to cause the MOSFET to shunt current from its diode (through its channel) whenever the anti-parallel diode is forward-biased. Hence, the MOSFET is often described as a "synchronous rectifier". Once again, however, a make-before-break interval is required between the time when the parasitic diode begins to conduct and time when the gate of the MOSFET is driven to turn the channel of the MOSFET on. During the break-before-make interval, the gate of the MOSFET is biased so as to turn the channel off.

Accordingly, as a general rule in this type of circuit, an interval must exist during which the parasitic PN diode in the MOSFET is conducting and before the MOSFET (or some other MOSFET in the circuit) is turned on to divert the current flow from the diode to a channel. Parasitic diode conduction cannot be avoided in most inductive power circuits.

When forward-biased, a PN diode is a minority carrier device and, as such, has a long recovery time compared to majority carrier devices. While the PN diode is forward-biased, minority carriers are stored in the PN diode. In the event that the PN diode once again becomes reverse-biased, the stored minority carriers increase the reverse recovery time of the PN diode (i.e., the time it takes a forward-biased diode to block a voltage applied in the reverse direction). Furthermore, once the minority carriers are removed under reverse-bias, a rapid voltage transient (i.e., large dv/dt) will occur, and voltage spikes beyond the supply voltages may also occur.

This same phenomenon applies to the anti-parallel diode within a MOSFET and can degrade the performance of the MOSFET should its parasitic PN diode become momentarily forward-biased. During the operation of an N-channel MOSFET in Quadrant I (where the source terminal is connected to a lower voltage than the drain terminal), the parasitic diode is reverse-biased and will conduct no current. However, if the MOSFET should operate in Quadrant III (where the source terminal is connected to a higher voltage than the drain terminal), the parasitic diode will become forward-biased and will conduct a current with minority carriers. (Note. Unless otherwise specified herein, in MOSFETs where the body is shorted to a drain/source terminal, the shorted terminal will be referred to as the "source" and the non-shorted terminal will be referred to as the "drain". In instances where the terms source and drain relate to their electrical function rather than their structure, the term "electrical source" or "electrical drain" will be used. For an N-channel MOSFET, the "electrical source" is more negative than the "electrical drain". For a P-channel MOSFET, the reverse is true.)

When the MOSFET returns to Quadrant I operation, the stored charge must be absorbed by the drain-to-source source current of the MOSFET. Thus the switching time during the on-off transition and any associated power loss of the MOSFET will be increased. Moreover, at the instant all the stored charge is absorbed a rapid voltage transition (i.e. large dv/dt) may occur. The large dv/dt in turn can cause snapback problems in the MOSFET (a form of undesirable bipolar transistor action), or trigger a latchup condition in an integrated circuit (where control of the device is lost).

If the MOSFET is part of an integrated circuit (IC), the current flowing through the parasitic diode may cause injection of minority carriers into the substrate of the IC. These minority carriers can travel through the substrate and cause various problems, such as latchup or snapback, in other devices throughout the IC.

Furthermore, the current through the parasitic diode can introduce charges into the IC that become majority carriers in different regions of the IC. In this situation voltage drops will occur in the IC creating a "ground bounce" situation in the IC (i.e., spatially varying ground potentials), which can cause latchup problems.

To avoid the problems caused by the parasitic diode of a MOSFET, the current which would pass through the parasitic diode of the MOSFET during Quadrant III operation can be shunted away from the parasitic diode by placing a shunting device in parallel with the diode. Moreover, a shunting device can also be used in parallel with any PN diode in order to prevent the problems caused by the minority carriers of a PN diode. Ideally, the shunting device should conduct no current when the PN diode is reverse-biased and turn on at a lower voltage than the PN diode when the PN diode is forward-biased. Due to the physical properties of silicon, silicon PN diodes have a turn-on voltage of 0.6 to 0.8 V. Within this range, a higher forward-bias voltage corresponds to higher current densities and more stored minority carrier charge. Therefore, the shunting device should have a turn-on voltage less than 0.6 V. Furthermore, for the parasitic diode of a MOSFET, the shunting device should also have a low recovery time so that the turn-off time of the MOSFET will not be degraded by the shunting device.

It is known in the art to use a Schottky diode as the shunting device. A Schottky diode is characterized by a low turn-on voltage (typically 0.2 to 0.3 volts), fast turn-off, and non-conductance when the Schottky diode is reverse-biased. Therefore, a Schottky diode can perform the functions of the shunting device.

However, to add Schottky diodes to an IC requires additional process steps. Specifically, to create a Schottky diode a metal-silicon barrier must be formed. In order to obtain the proper characteristics for the Schottky diode, the barrier metal will likely be different than the metal used in other process steps, such as metal ohmic contacts. These additional steps add cost and complexity to the IC.

Alternatively, discrete Schottky diodes can be connected in parallel with the MOSFET or PN diode of the IC in a multi-chip solution. However, in this type of connection there will exist various resistances, capacitances, and inductances within the connecting wires that may delay the Schottky diode's turn-on so that the parasitic or stand-alone PN diode will turn on before the Schottky diode. Furthermore, the use of discrete Schottky diodes is not ideal, since the clamping of the parasitic or stand-alone diode should be localized by placing the Schottky diode as close as possible to the parasitic or stand-alone diode.

Therefore, what is needed is a shunting device which can be manufactured in an IC without requiring additional process steps, and which has a turn-on voltage lower than that of a silicon diode, a fast recovery time when switched from a forward-bias to reverse-bias condition, and non-conductance under reverse bias. Ideally, the shunting device could be merged into the power MOSFET itself without compromising the on-resistance or current density of the device.

SUMMARY OF THE INVENTION

This invention makes use of the "body effect" which occurs in a MOSFET when the PN junction between the body and the drain (electrical source) of the MOSFET is partially forward-biased. As a result of the body effect, the threshold voltage of the MOSFET is reduced, so that a relatively small voltage applied to the gate will cause a current to flow predominantly through the channel of the MOSFET, as compared to the parasitic diode that is formed at the body-drain junction. For example, with an N-channel MOSFET, if the body is given a small positive bias in relation to the drain (e.g., 0.05–0.6 V), the gate-to-source voltage $V_{gs}$ that is necessary to turn on the channel of the MOSFET is reduced. With a P-channel MOSFET, if the body is given a small negative bias in relation to the drain, the $V_{gs}$ required to turn on the channel is likewise reduced in an absolute sense (i.e., a less negative $V_{gs}$ is required).

This application and the two related applications referred to above (application Ser. No. 08/648,334 and application Ser. No. 08/649,774, all relate to lowering the threshold voltage of a MOSFET by means of the body effect.

In the two-terminal version of the MOSFET, described in application Ser. No. 08/648,334, the source, body and gate of a MOSFET are hard-wired together, and a single voltage supply provides the drain-to-source voltage $V_{ds}$, the gate bias and the body bias. Assuming an N-channel, the device necessarily blocks current in Quadrant I, where $V_{ds}$ is positive, and conducts current in Quadrant III, where $V_{ds}$ is negative, functioning as a diode which has a turn-on voltage lower than that of a normal PN diode, although not necessarily as low as that of a Schottky diode. In recognition of these characteristics, the two-terminal version is referred to herein as a "pseudo-Schottky diode", a name which will also be recognized as describing the physics of the MOSFET operation under certain conditions which make it behave more like a true Schottky diode than like a variable resistor.

Since a pseudo-Schottky diode is a two-terminal device, there is no timing involved in providing its gate drive. Relying on majority carrier conduction, a pseudo-Schottky diode does not suffer from stored minority carriers, and it therefore has a short reverse recovery time.

In the four-terminal version described in application Ser. No. 08/649,774, the source, body, drain and gate are controlled independently of each other. The MOSFET is operated in two modes: an on-state where both its gate and body are independently biased to positive potentials (assuming an N-channel device) so as to invert the channel of the MOSFET and partially forward-bias the junction between its body and its source ($V_{sb}<0$); and an off-state where its body is shorted to its source ($V_{sb}=0$). In the on-state, the MOSFET generally operates in Quadrant I, and the independently controllable forward-bias applied to its source-body junction lowers its threshold voltage and thereby increases its drain current as compared to the case where $V_{sb}=0$. In the off-state, the MOSFET operates either in Quadrant III in the same way as a forward-biased pseudo-Schottky diode or as an off-diode in Quadrant I, depending on the drain potential.

This application describes the three-terminal version of the MOSFET, in which its source and body are shorted together but its gate is independently controlled. The three-terminal version is likewise operated in two modes: In its first mode of operation, the gate of the MOSFET is electrically tied to its source and body, and the device behaves exactly as a pseudo-Schottky diode; i.e., in Quadrant III the device conducts current and provides a voltage drop which is lower than that of a conventional PN diode, and in Quadrant I the device blocks current. In the second mode of operation, its gate is driven higher (assuming an N-channel device) so as to more completely turn on its channel. The device then generally acts as a normal MOSFET, but when operating in Quadrant III its threshold voltage is reduced because of the partial forward-biasing of its body-drain junction. Operated in Quadrant I, the device behaves as a normal MOSFET.

For reasons that will become apparent, the three-terminal version is generally referred to herein as a "pseudo-Schottky synchronous rectifier". The first mode of operation described above (where the device is in effect a two-terminal device) will sometimes be referred to as the "pseudo-Schottky state" of the pseudo-Schottky synchronous rectifier, and the second mode of operation described above will sometimes be referred to as the "MOSFET state" of the pseudo-Schottky synchronous rectifier. A third mode, discussed below, which occurs when the gate of the MOSFET is biased independently of the source-body so as to completely turn off the channel, is referred to as the "diode state".

The performance of a pseudo-Schottky synchronous rectifier is improved to the extent that the body effect is maximized and the threshold voltage is minimized. The objective is to maximize the ratio of the channel current to the body-drain diode (PN junction) current, and to minimize the body-to-drain voltage during conduction. Generally speaking, the MOSFET should have a high gain ($G_m$), a low on-resistance ($R_{ds}$), and a low threshold voltage ($V_t$). As will become apparent, the term "low on-resistance" is used in a somewhat unconventional sense, since in its pseudo-Schottky state the pseudo-Schottky synchronous rectifier conducts at a condition where the surface of the channel may not be fully inverted.

A pseudo-Schottky synchronous rectifier has numerous uses. In its preferred embodiment, a pseudo-Schottky synchronous rectifier is operated as a switch for controlling the flow of electrical power to a load. The source and body of the MOSFET are shorted together, and the gate is controlled by a switch which alternately connects the gate to the source (pseudo-Schottky state) or to a voltage which turns the channel of the MOSFET fully on (MOSFET state). Pseudo-Schottky synchronous rectifiers are particularly useful in switching-mode power converters, for example, where the device can be used in place of the conventional MOSFET that normally serves as a synchronous rectifier. In the "break-before-make" interval which occurs before the synchronous rectifier is turned on, the device operates in the pseudo-Schottky state with a lowered threshold voltage so as to reduce the power loss and stored charge. By biasing the gate to the source (rather than ground, for example) current flows through the channel of the MOSFET rather than through its parasitic anti-parallel diode. Since the voltage drop across the channel is substantially lower than the voltage drop across the anti-parallel diode, the IV power loss in the synchronous rectifier is reduced, and problems associated with stored charge in the intrinsic PN diode of a conventional MOSFET are reduced or virtually eliminated.

At the end of the break-before-make interval, the pseudo-Schottky synchronous rectifier is moved into its MOSFET state where the gate is driven so as to turn the MOSFET fully on.

Since in its pseudo-Schottky state a pseudo-Schottky synchronous rectifier turns on at a lower voltage than a normal PN diode, it may also be used to clamp the voltage across other diodes and transistors in an integrated circuit (IC) chip. This limits charge storage and forward conduction in the other diodes, conditions which can lead to minority carrier injection, MOSFET snapback, and latchup of the IC chip.

A pseudo-Schottky synchronous rectifier should be designed to have a low threshold voltage, a high body dopant concentration, a short channel length, and a large gate width per unit area. A threshold adjust ion implantation is typically required to offset the effect of those factors (e.g., high body doping) which tend to increase the threshold voltage. According to one aspect of this invention, in a lateral device the threshold adjust ion implantation is performed prior to the formation of the gate. According to another aspect of the invention, for devices which require large "root Dt" processes (D being the diffusivity of the dopant and t being time), the threshold adjust implantation is performed either through the gate oxide and gate (after any long, high-temperature furnace operation) or by introducing relatively immobile (slow diffusing) ions such as cesium into the gate oxide prior to the formation of the gate.

The design criteria for the thickness of the gate oxide layer require a compromise between optimizing the performance of the device in its pseudo-Schottky state, which implies a thick gate oxide layer to reduce the threshold voltage by enhancing the body effect, and optimizing the performance of the device in its MOSFET state, which implies a thinner gate oxide layer to minimize the on-resistance of the device. Also, the design of the drain is important to reduce the on-resistance on the pseudo-Schottky synchronous rectifier in its MOSFET state of operation.

BRIEF DESCRIPTION OF THE DRAWINGS

FIG. 8 illustrates a cross-sectional view of an IC showing the use of a pseudo-Schottky synchronous rectifier to prevent diode recovery snapback caused by injection of minority carriers by the parasitic diode in an N-channel MOSFET.

FIG. 10 illustrates a cross-sectional view of an IC showing the use of a pseudo-Schottky synchronous rectifier to prevent latchup of an IC caused by injection of minority carriers into the substrate by the parasitic diode.

FIG. 14G illustrates a graph showing an alternative dopant concentration profile for the pseudo-Schottky synchronous rectifier of FIG. 14E.

FIGS. 15A–15C illustrate cross-sectional views showing a method of forming an pseudo-Schottky synchronous rectifier based on a vertical DMOSFET.

FIG. 16 illustrates a graph showing the log of the current (per unit gate width) versus the voltage between the terminals of a pseudo-Schottky synchronous rectifier as compared with those of a threshold-connected MOSFET (FIG. 1B).

FIG. 17 illustrates a graph showing the current density in a pseudo-Schottky synchronous rectifier as a function of the body doping concentration for three gate oxide thicknesses (with the threshold voltage and the voltage across the diode being held constant).

FIG. 18 illustrates a graph showing lines of equal current density in a pseudo-Schottky synchronous rectifier as a function of both body doping concentration and gate oxide thickness (with the threshold voltage and the voltage across the rectifier being held constant).

DESCRIPTION OF THE INVENTION

A pseudo-Schottky synchronous rectifier operates by making use of a phenomenon which is present in a low-threshold-voltage MOSFET operated with its body diode forward-biased and its gate enhanced. To understand this phenomenon, it is useful to consider the possible configurations of a MOSFET which is connected to two terminals.

FIGS. 1A–1D illustrate the four possible configurations of an N-channel MOSFET 100 as a two terminal device, and FIGS. 1E–1H show the associated IV graphs of the devices. As stated above, in order to avoid confusion in describing transistors where the body is shorted to a drain/source terminal of the MOSFET, the shorted terminal will be referred to as the source and the non-shorted terminal will be referred to as the drain.

Figure 1A:
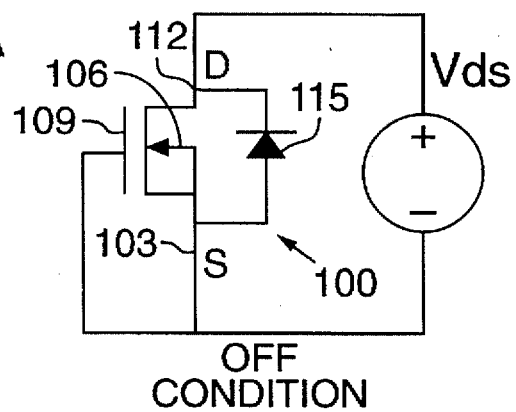
FIGS. 1A–1D illustrate circuit diagrams showing four possible ways of connecting a MOSFET as a two-terminal device.
Figure 1E:
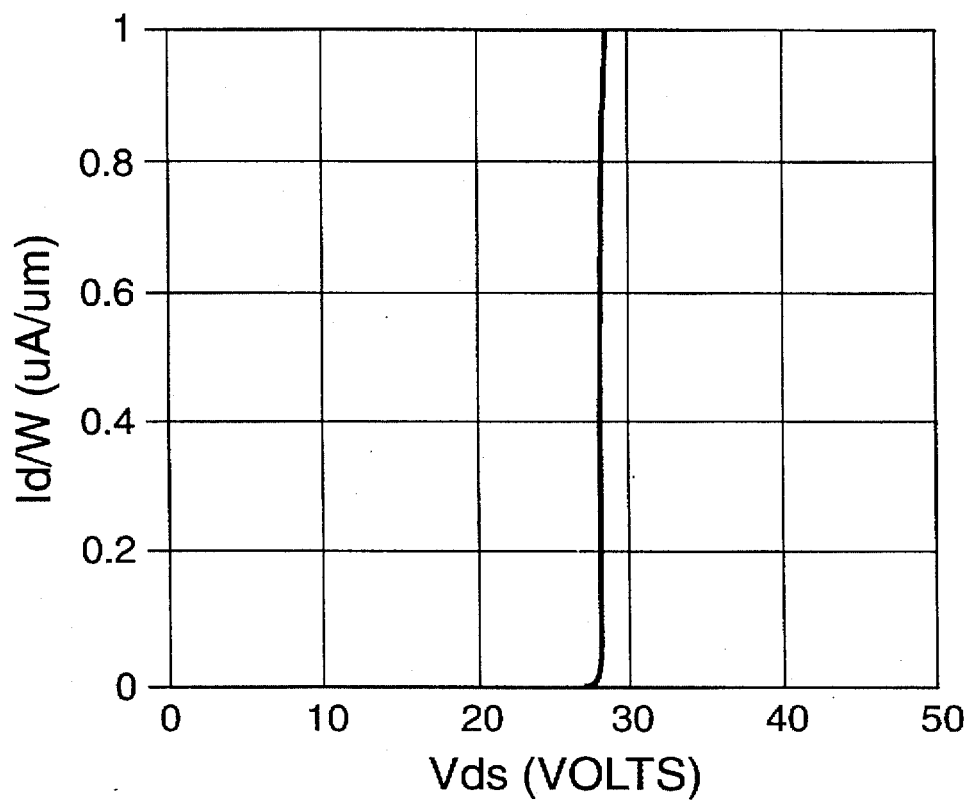
FIGS. 1E–1H illustrate graphs showing the electrical characteristic of the configurations shown in FIGS. 1A–1D, respectively.

Thus, in MOSFET 100 shown in FIG. 1A the source terminal is labeled 103 and the drain terminal is labeled 112. Mosfet 100 also includes a body 106 and a gate 109. The reference numeral 115 designates the anti-parallel diode which is inherent in MOSFET 100. As shown in FIG. 1A, the gate 109, the body 106 and the source terminal 103 are connected to negative voltage while the drain terminal 112 is connected to a positive voltage. Since the gate 109 is biased at the most negative potential, the channel of the MOSFET does not conduct. Furthermore, the parasitic diode 115 is reverse-biased and does not conduct. This configuration may be termed the "Off" configuration since under normal conditions no current flows through the MOSFET until the voltage reaches the breakdown voltage (BV$_{dss}$) of the anti-parallel diode 115. The IV characteristic of MOSFET 100 connected as in FIG. 1A is shown in FIG. 1E, which shows a sharp current increase when the drain-to-source voltage V$_{ds}$ reaches the breakdown voltage BV$_{dss}$ of diode 115.

Figure 1B:
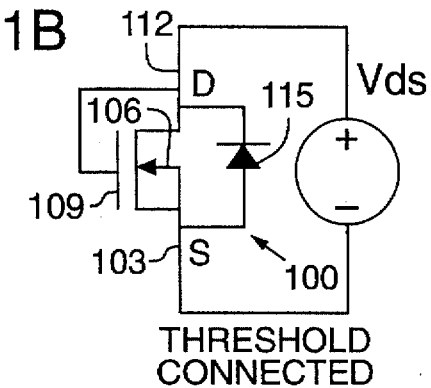
Figure 1F:
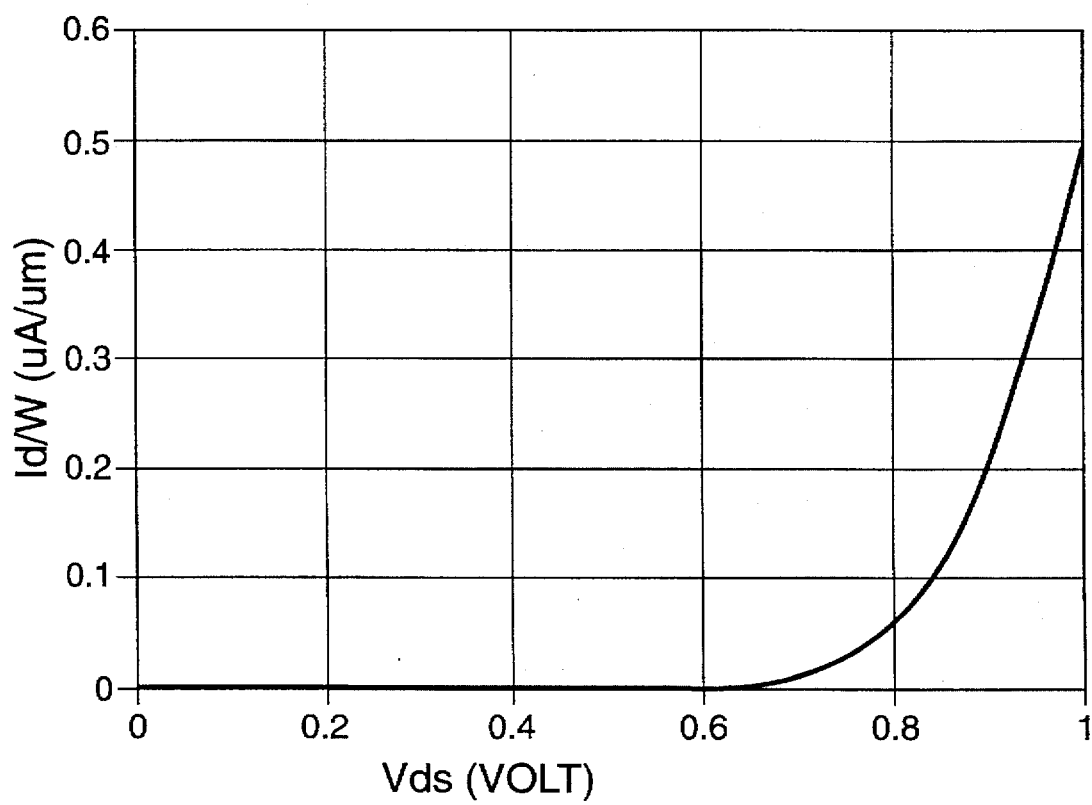

In the configuration shown in FIG. 1B, the gate 109 and the drain terminal 112 are tied to the positive voltage while the body 106 and the source terminal 103 are tied to the negative voltage. The parasitic diode 115 remains reverse-biased and nonconductive. However, since the gate 109 is tied to the positive power terminal, current will flow through the channel once the voltage reaches the threshold voltage V$_t$ of the MOSFET. This is designated the "Threshold Connected" condition. The IV characteristic of MOSFET 100 connected as in FIG. 1B is shown in FIG. 1F, which shows a sharp current increase when V$_{ds}$ reaches approximately 0.8 V. While this connection gives a quick estimate of the MOSFET's threshold voltage, the true threshold voltage of the device must be determined by extrapolation methods that are described in numerous sources. Generally, these methods involve plotting I$_D$ versus V$_{gs}$ (on linear paper) for linear operation where V$_{ds}$ is small and plotting I$_D^{1/2}$ versus V$_{gs}$ for operation in the saturation region where V$_{gs}$ is large (several volts).

Figure 1C:
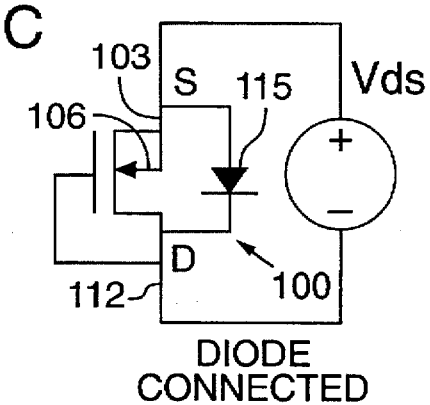
Figure 1G:
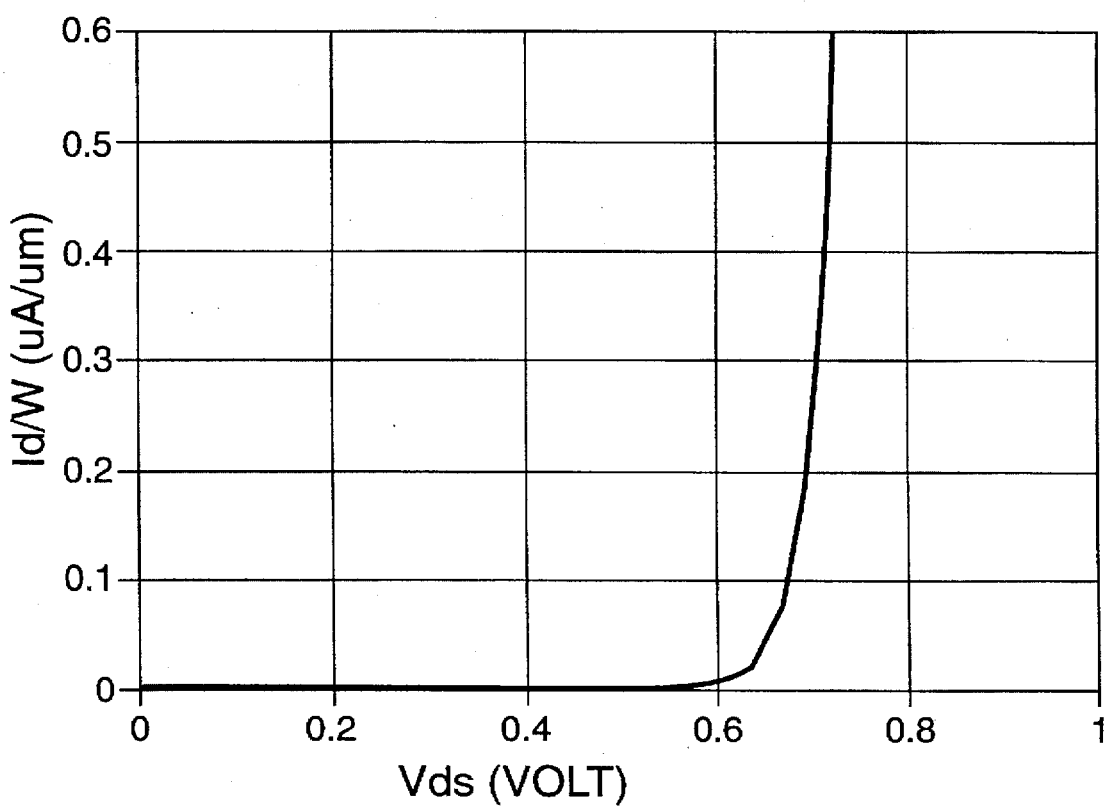

FIG. 1C illustrates the "Diode Connected" condition. The source terminal 103 and body 106 are connected to the positive voltage while the gate 109 and drain 112 are connected to the negative voltage. Since the gate 109 is connected to the most negative potential the channel of MOSFET 100 will not conduct a current. However, the parasitic diode 115, which is forward-biased, will conduct at its turn-on voltage V$_{diode}$ (0.6–0.8 Volts). The IV characteristic of MOSFET 100 connected as in FIG. 1C is shown in FIG. 1G, which shows a sharp current increase when V$_{ds}$ reaches V$_{diode}$.

Figure 1D:
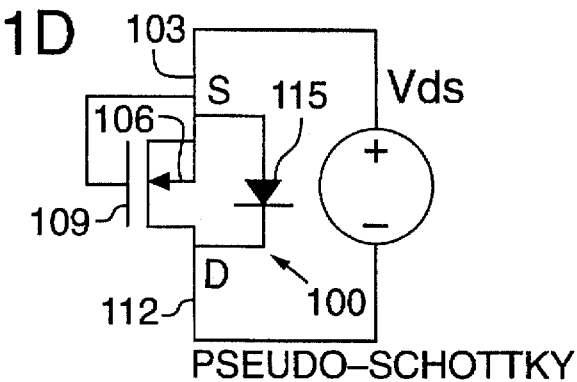
Figure 1H:
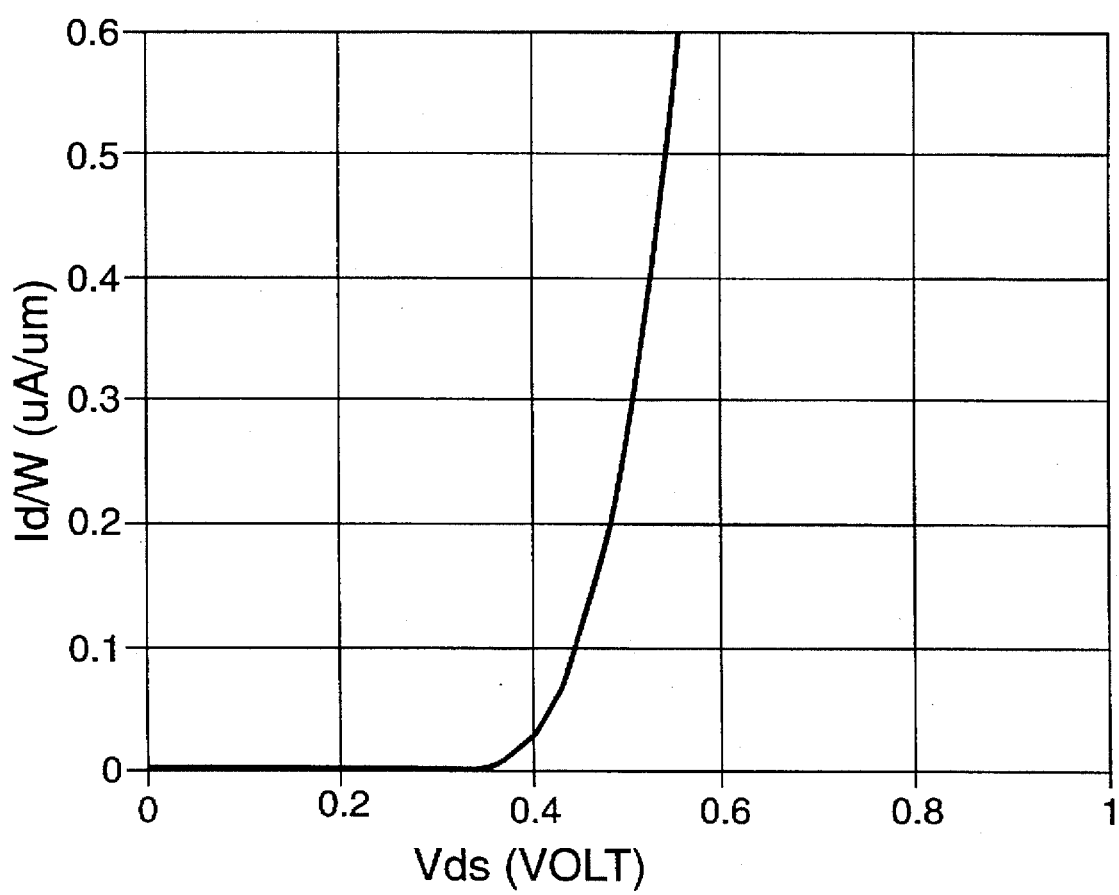

FIG. 1D illustrates the "pseudo-Schottky" diode configuration of this invention. The gate 109, source terminal 103, and body 106 are all connected to the positive voltage, while only the drain terminal 112 is connected to the negative voltage. In this configuration, for low current the MOS portion of the transistor will begin to conduct at the pseudo-Schottky voltage, designated $V_{ps}$ (0.3–0.5 V), which is significantly less than the normal diode turn on-voltage of 0.6 to 0.8 V or the threshold voltage of 0.8 V. The IV characteristic of MOSFET 100 connected as in FIG. 1D is shown in FIG. 1H, which shows a sharp current increase when $V_{ds}$ reaches $V_{PS}$. Note that the pseudo-Schottky diode configuration shown in FIG. 1D is identical to the pseudo-Schottky state of a pseudo-Schottky synchronous rectifier and can be achieved by shorting the gate to the source and body terminals of the MOSFET whenever conduction occurs in the parasitic anti-parallel diode, and operating the gate independently otherwise.

Figure 2:
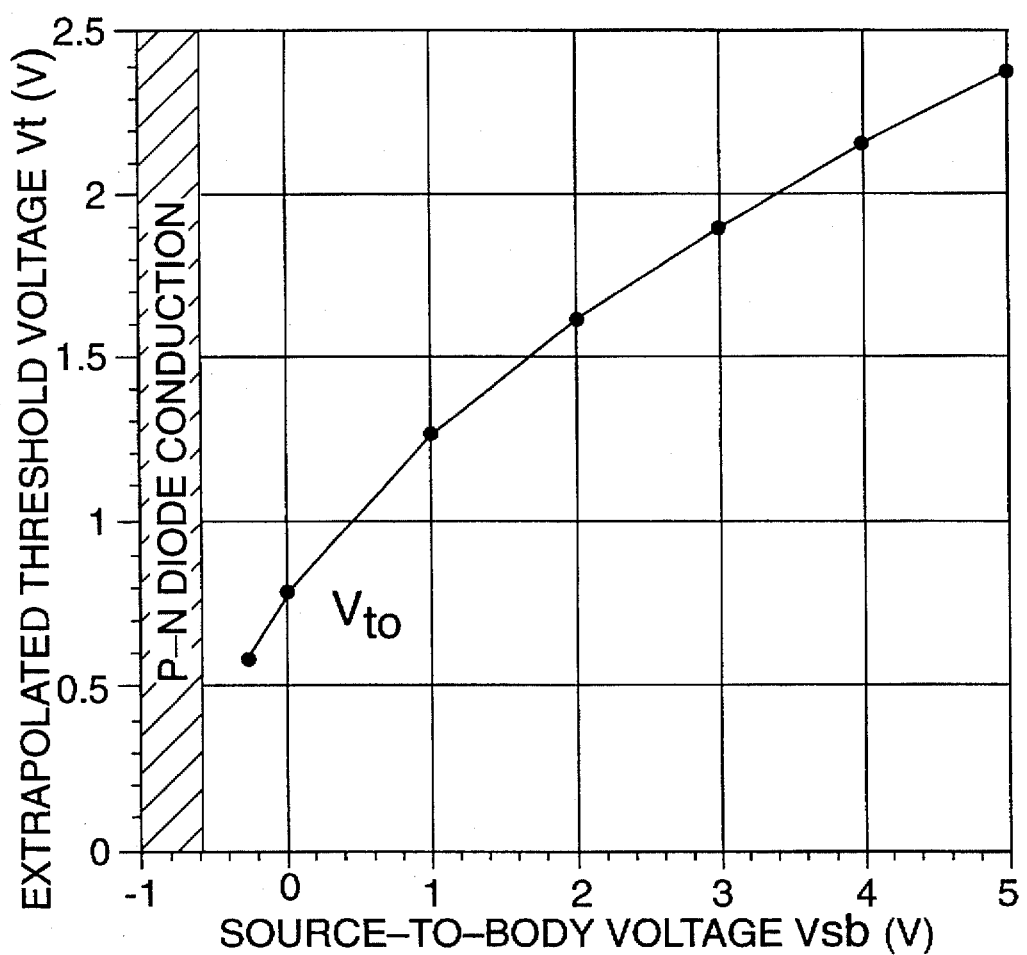
FIG. 2 illustrates a graph showing the threshold voltage ($V_t$) of a MOSFET as a function of the source-body voltage ($V_{sb}$) of the MOSFET.

FIG. 2 is a graph of the threshold voltage, $V_t$ of a four-terminal MOSFET (i.e., a MOSFET wherein the body is not shorted to either the source or the drain) as a function of the source-to-body voltage ($V_{sb}$) applied to the MOSFET. In this case the source is defined as the terminal connected to the negative potential while the drain is defined as the terminal connected to the positive potential. The threshold voltage when the customary source-body short is present ($V_{sb}$=0), is designated as $V_{t0}$. As can be seen from FIG. 2, $V_t$, the threshold voltage of the MOSFET, is lower when $V_{sb}$ is negative (i.e., when the body is biased above the source). The cause of this change of the threshold voltage with $V_{sb}$ is called the "body effect". The body effect is commonly assumed to be an increase in threshold voltage resulting from reverse-biasing the source-to-body junction, but in the case of the pseudo-Schottky diode the partial forward-biasing of the source-to-body junction (negative $V_{sb}$) leads to a lowering of $V_t$, i.e., an "anti-body effect".

Figure 3:
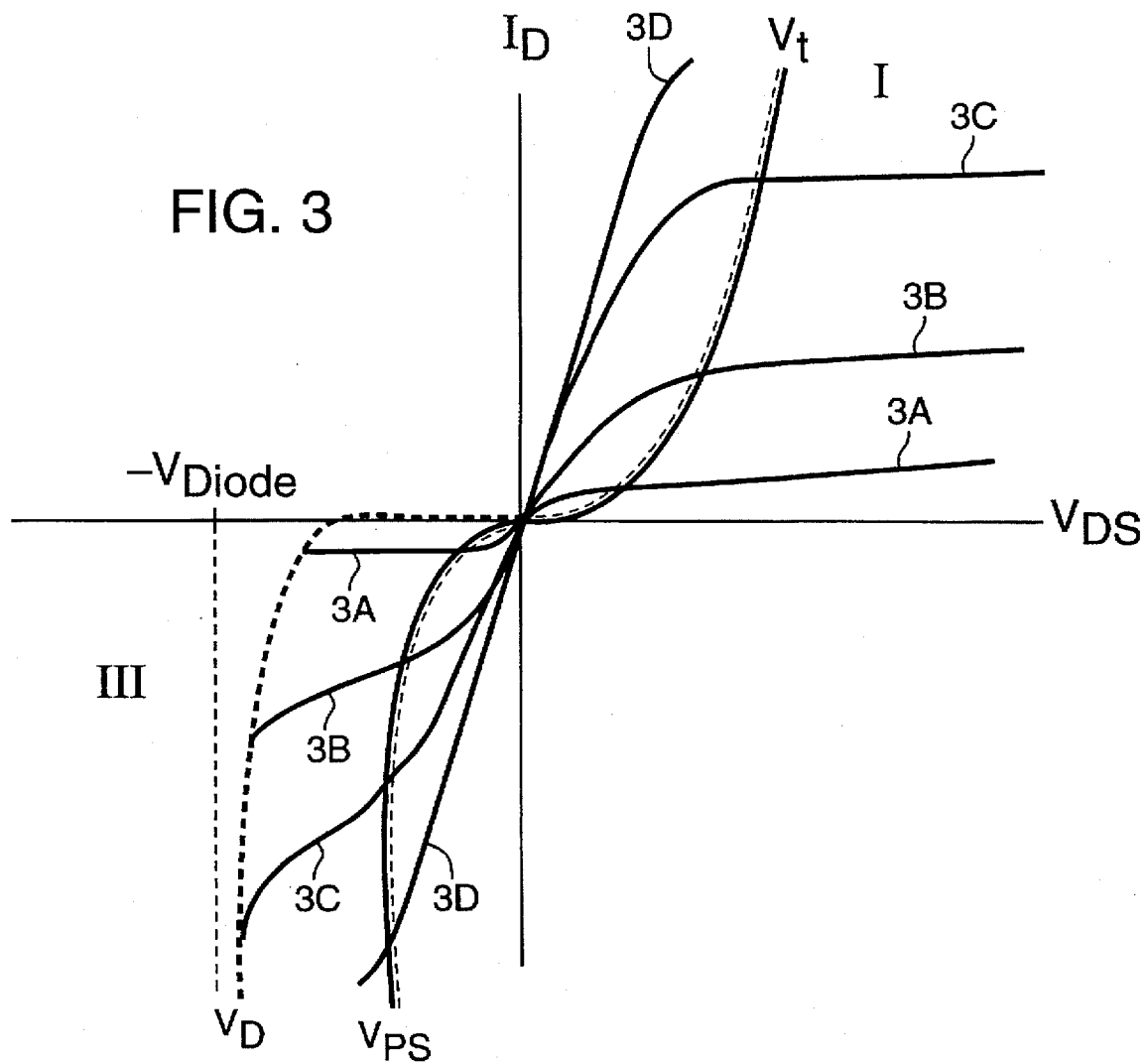
FIG. 3 illustrates a graph showing the drain current ($I_d$) as a function of the drain-source voltage ($V_{ds}$) at various levels of gate bias.

The curves designated 3A, 3B, 3C and 3D in FIG. 3 show the drain-to-source current $I_d$ of a MOSFET as a function of the drain-to-source voltage ($V_{ds}$) at various positive gate biases ($V_{gs}$). The source and body of the MOSFET are shorted together. In Quadrant I, where the drain is biased positive with respect to the source, the MOSFET acts essentially as a resistor until saturation is reached, and then the MOSFET acts as a constant current source. The curve designated $V_t$ shows $I_d$ as a function of $V_{ds}$ if the gate is connected to the drain ($V_{gs}$=$V_{ds}$), which is the "Threshold Connected" configuration shown in FIG. 1B. In Quadrant III, the source is biased positive with respect to the drain. The curves 3A–3D initially are symmetrical about the origin, but when $V_{ds}$ reaches $-V_{diode}$, the forward-biased parasitic diode turns on and thereafter the current through the diode overshadows the current through the channel of the MOSFET as $V_{ds}$ becomes more negative. Before $V_{ds}$ reaches $-V_{diode}$, however, the $I_d$ curves are affected by the body effect and the resultant lowering of the threshold voltage as shown in FIG. 2. This tends to increase the current through the channel before the parasitic diode begins to conduct. Most of this channel current is carried by majority carriers, which greatly diminishes the problems caused by minority carriers.

The curve designated $V_{PS}$ represents $I_d$ as a function of $V_{ds}$ when the source (the more positive terminal in Quadrant III) is tied to the gate. In this condition, the increasing gate bias relative to the drain (the most negative terminal in the MOSFET in Quadrant III), combines with the body effect which results from the increasing potential of the body relative to the drain, and which reduces the threshold voltage $V_t$ (see FIG. 2), to cause the MOSFET to begin conducting at a voltage in the range of 0.2 to 0.3 V lower.

Accordingly, curve $V_{PS}$ in FIG. 3 reveals that a MOSFET configured as shown in FIG. 1D behaves in the manner of a diode with a turn-on voltage which, while not normally as low as that of a true Schottky diode, is nonetheless significantly below the turn-on voltage of a conventional PN diode. The MOSFET of FIG. 1D is therefore referred to as a "pseudo-Schottky diode", which is identical to a pseudo-Schottky synchronous rectifier in its pseudo-Schottky state. The pseudo-Schottky diode has an anode at the terminal to which the body and gate of the MOSFET are tied and a cathode at the opposite terminal of the MOSFET.

Figure 4A:
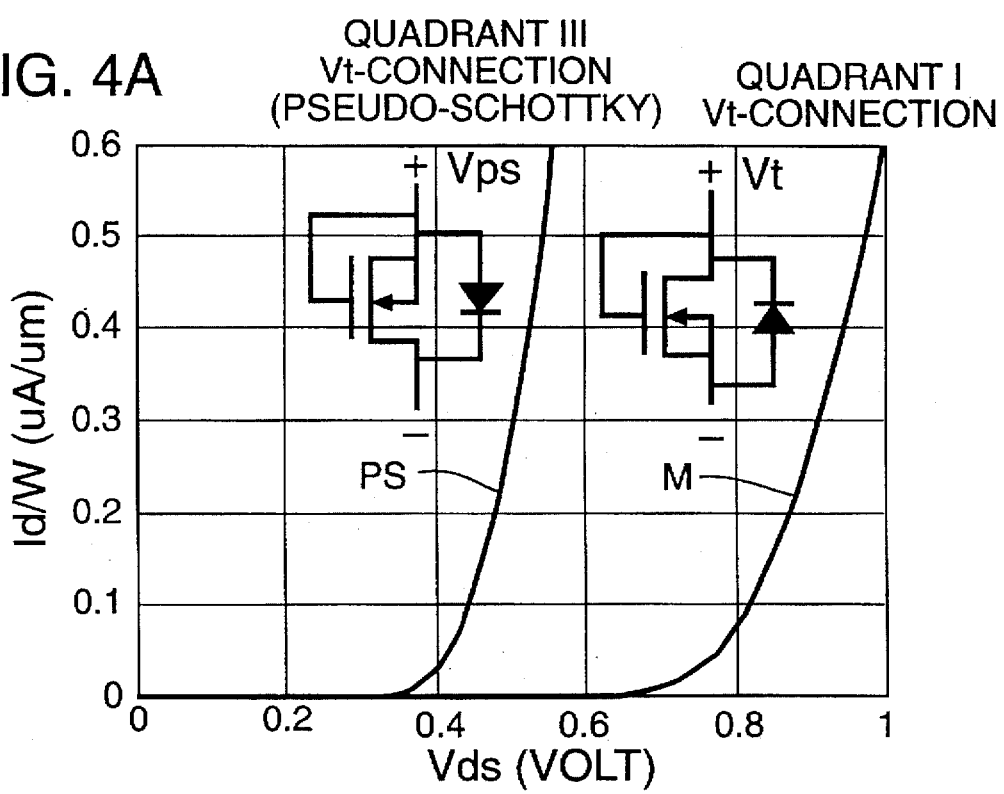
FIGS. 4A and 4B illustrate graphs which compare the IV characteristics of a pseudo-Schottky diode and a threshold connected MOSFET.
Figure 4B:
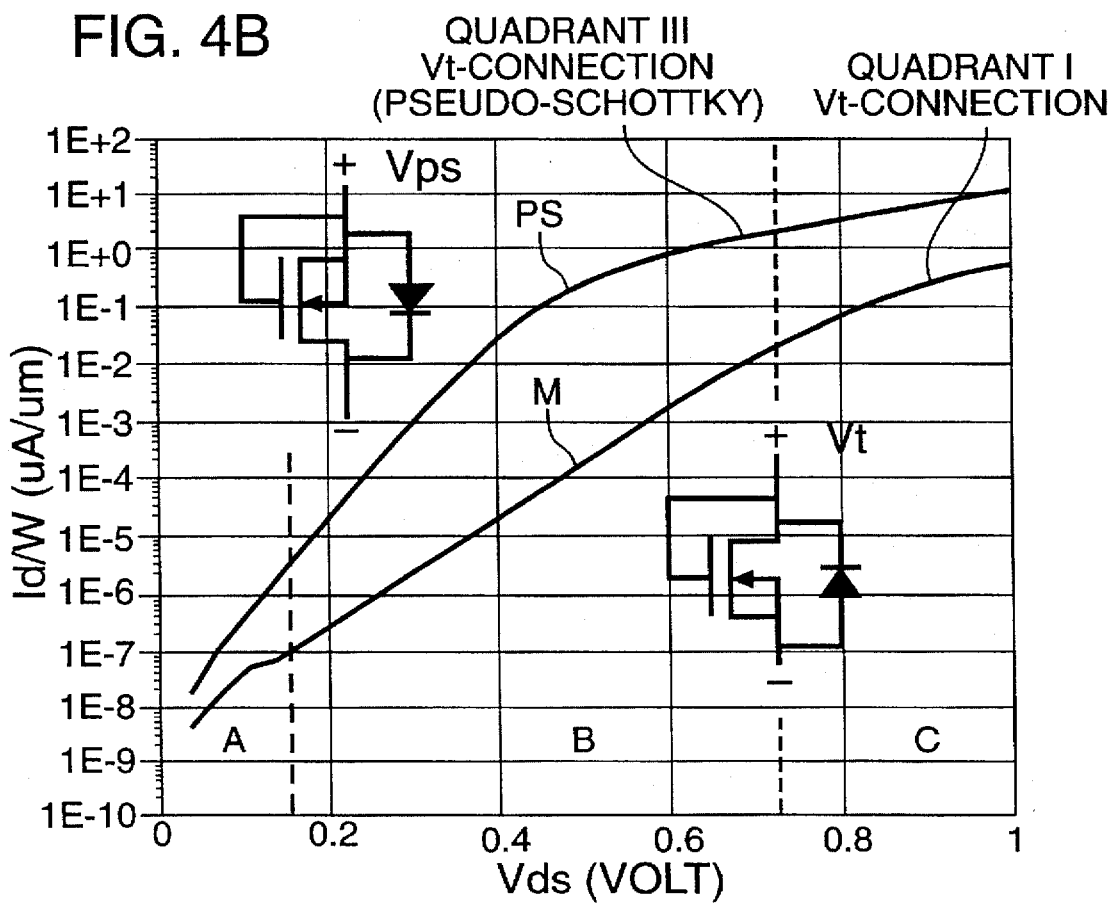

FIGS. 4A and 4B compare the drain-to-source current $I_d$ of a MOSFET (in µA/µm of channel width) in Quadrant I operation versus the $I_d$ of a pseudo-Schottky diode (i.e., a device which exhibits the pseudo-Schottky effect) in Quadrant III operation. As noted above, a pseudo-Schottky synchronous rectifier in its pseudo-Schottky state is equivalent to a pseudo-Schottky diode. The curve designated PS relates to the pseudo-Schottky diode, and the curve designated M relates to the MOSFET. In both cases, the gate of the MOSFET is tied to the more positive terminal of the MOSFET. FIG. 4A shows that due to the lower turn-on voltage of the pseudo-Schottky diode, the IV curve of the pseudo-Schottky diode is shifted towards the origin. FIG. 4B plots the log of $I_d$ to afford a better comparison of the currents, particularly in the subthreshold region of $V_{ds}$. In section A, only leakage current is passing through both the pseudo-Schottky diode and the MOSFET, and therefore the currents are approximately equal. In section B of the graph, the pseudo-Schottky diode has turned on; therefore, the pseudo-Schottky current is much larger than the MOSFET current. In section C, the MOSFET turns on and the body effect disappears so that the currents are once again equal. It is noteworthy that $I_d$ is several orders of magnitude higher in the pseudo-Schottky diode than in the MOSFET when $V_{ds}$ is in the range 0.2–0.6 V.

Figure 5A:
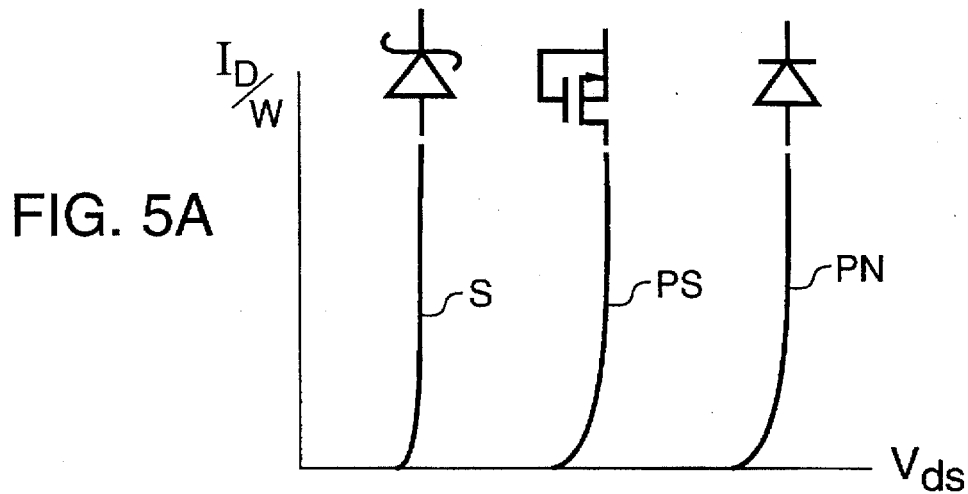
FIGS. 5A and 5B illustrate graphs which compare the IV characteristics of the a Schottky diode, a pseudo-Schottky diode, and an ideal PN diode.
Figure 5B:
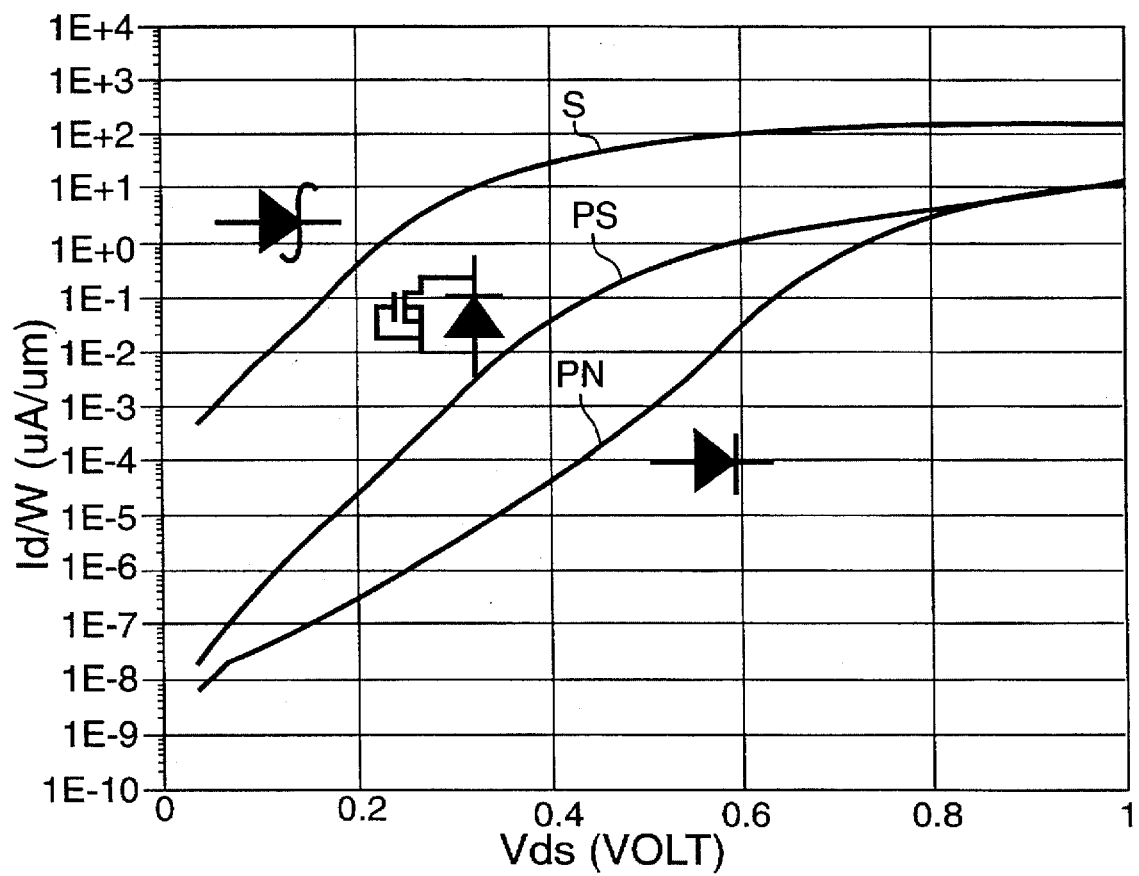

FIGS. 5A and 5B compare the IV characteristics of a Schottky diode (curve S), a pseudo-Schottky diode (curve PS), and a PN diode (curve PN). FIG. 5A plots $I_d$ and FIG. 5B plots log $I_d$. A parasitic PN diode in a MOSFET will exhibit similar characteristics to the PN diode. As shown in FIG. 5B, for voltages between the turn-on of the pseudo-Schottky diode and the turn-on of the PN diode (e.g., in the range 0.3–0.5 V), the current through the pseudo-Schottky diode can be over 100 times greater than that of the PN diode. Therefore, for these voltages the pseudo-Schottky diode provides a very effective shunting device for a PN diode.

Figure 6:
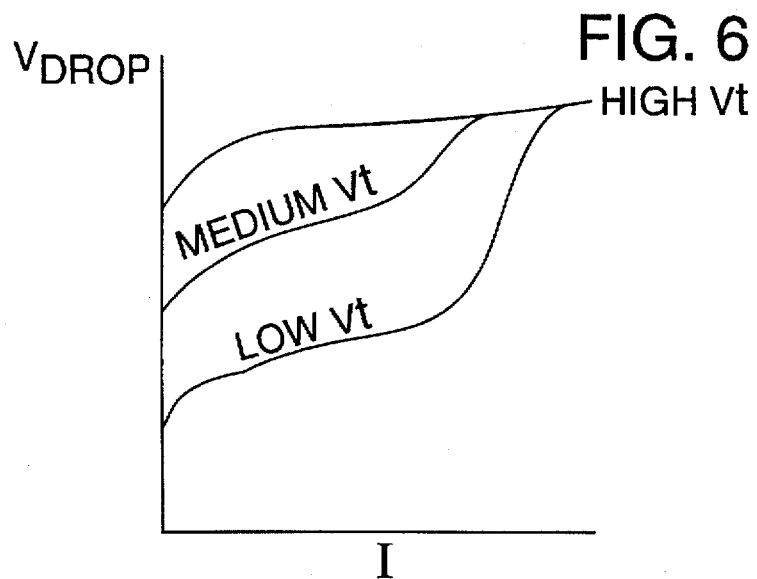
FIG. 6 illustrates a graph showing the voltage drop of a pseudo-Schottky diode under varying $V_t$ conditions.

FIG. 6 shows the voltage drop across a pseudo-Schottky diode ($V_{DROP}$) as a function of the current I for several threshold voltages $V_t$ of the MOSFET, where the threshold voltage is varied but the body effect is still pronounced. If a MOSFET has a high $V_t$ the body effect will be unable to lower the threshold enough for any significant conduction through the channel before the MOSFET's parasitic diode begins to conduct. For a low $V_t$ the body effect will lower the threshold of the MOSFET below the turn on voltage of the parasitic diode so that channel conduction will occur before the parasitic diode turns on. For medium $V_t$ channel conduction will occur to a lesser extent. The lower the threshold voltage, the higher the current density before the PN diode conduction overtakes the pseudo-Schottky (channel) conduction.

Figure 7A:
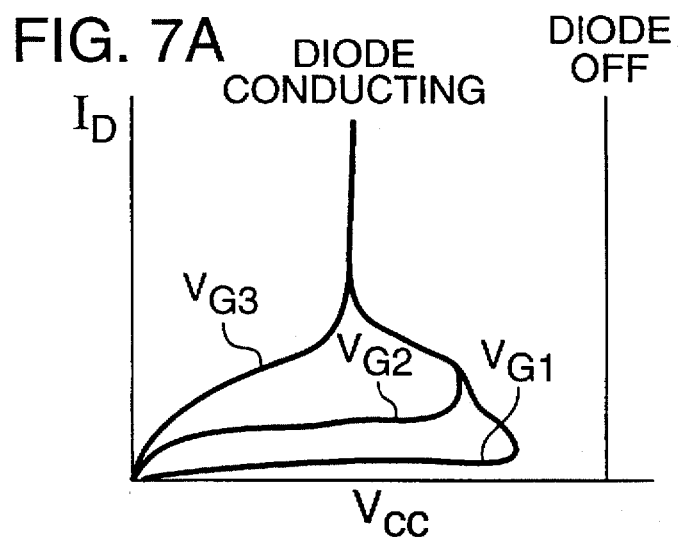
FIG. 7A illustrates a graph of a family of curves showing the snapback problem caused by the parasitic diode of a MOSFET.

FIG. 7A shows the IV characteristic of a MOSFET suffering from a snapback condition. $V_{G1}$, $V_{G2}$ and $V_{G3}$ represent different levels of gate drive voltage. During a snapback a voltage drop occurs in the MOSFET which forward biases the source to body junction when the drain is at a high positive potential. The parasitic bipolar transistor of the MOSFET begins to conduct at a lower voltage than breakdown voltage of the MOSFET. An example of this condition will be discussed below. At relatively low values of drain current, each of the three curves in FIG. 7A represents a normal MOSFET IV characteristic. Snapback occurs, however, where the device enters a region of negative resistance as the bipolar transistor turns on, and thereafter the current increases dramatically. The shapes of the curves can vary in the transitional region where the curves merge.

Figure 7B:
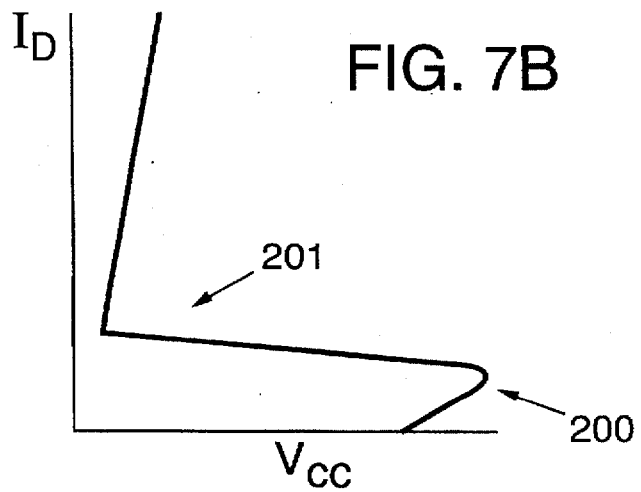
FIG. 7B illustrates a graph which shows the CMOS latchup problem caused by the parasitic diode of a MOSFET.

FIG. 7B shows the IV characteristic of an integrated circuit suffering from latchup. When the current reaches a certain point (designated 200 in FIG. 7B), the MOSFET will latch up and begin to conduct a sizeable current with almost no voltage drop (represented as region 201 in FIG. 7B). Even if the device survives the latchup current, the only way to restore normal operation is to momentarily remove the power from the device.

FIG. 8 illustrates the use of a pseudo-Schottky synchronous rectifier to avoid a snapback condition. An N-channel MOSFET 800, shown in cross-section, is connected in a circuit which includes an inductor 830 connected to the drain of MOSFET 800. Inductor 830 represents any inductance that is present in the circuit. MOSFET 800 includes an N+ source 809, which is shorted to a P-epitaxial layer 810 and a P+ substrate 820, and a drain 811. P-epitaxial layer 810 and a P+ substrate 820 together form the body of MOSFET 800. When a negative voltage spike from inductor 830 drives drain 811 below ground, the parasitic diode 802 becomes forward-biased and injects minority carriers in the form of electrons 805 into P-epitaxial layer 810 and P+ substrate 820. While some of these electrons recombine with holes 807, or are collected by the source 809, the net result is that the entire region around drain 811 will be flooded with minority carriers. If the voltage on drain 811 is suddenly pulled positive again (either by inductor 830 or some other device), these minority carriers prevent the voltage from rising until they are removed or have recombined with holes. Once the minority carriers have been exhausted, the voltage will then rise very rapidly, causing a large dv/dt and a large displacement current. This large displacement current, along with any impact ionization currents, can in turn cause a voltage drop within the P-epitaxial layer 810 of MOSFET 800. If the P-epitaxial layer 810 becomes more positive than the N+ source 809, it begins to inject electrons and triggers bipolar conduction. Turning on the parasitic bipolar transistor in the MOSFET 800 can lead to the snapback condition illustrated in FIG. 7A.

If, however, a pseudo-Schottky synchronous rectifier 850 is connected to MOSFET 800, with its "cathode" terminal 852 connected to drain 811 of MOSFET 800 and its "anode" terminal 854 connected to P+ substrate 820, which is grounded, the risk of snapback can be greatly reduced. Using the example described above, when the inductor 830 pulls the cathode of the pseudo-Schottky synchronous rectifier 850 and drain 811 of MOSFET 800 below ground, pseudo-Schottky synchronous rectifier 850 will begin to conduct (through its channel) before the parasitic PN diode 802. Thus, the current will be shunted away from the MOSFET 800 by pseudo-Schottky synchronous rectifier 850. Consequently, the presence of minority carriers in MOSFET 800 will be greatly diminished. Moreover, pseudo-Schottky synchronous rectifier 850 can be integrated with MOSFET 800, as will be explained later in this application, and in fact can be identical to MOSFET 800 so long as the gate of MOSFET 800 is shorted to the N+ source 809 when diode 802 is forward-biased.

Figure 9:
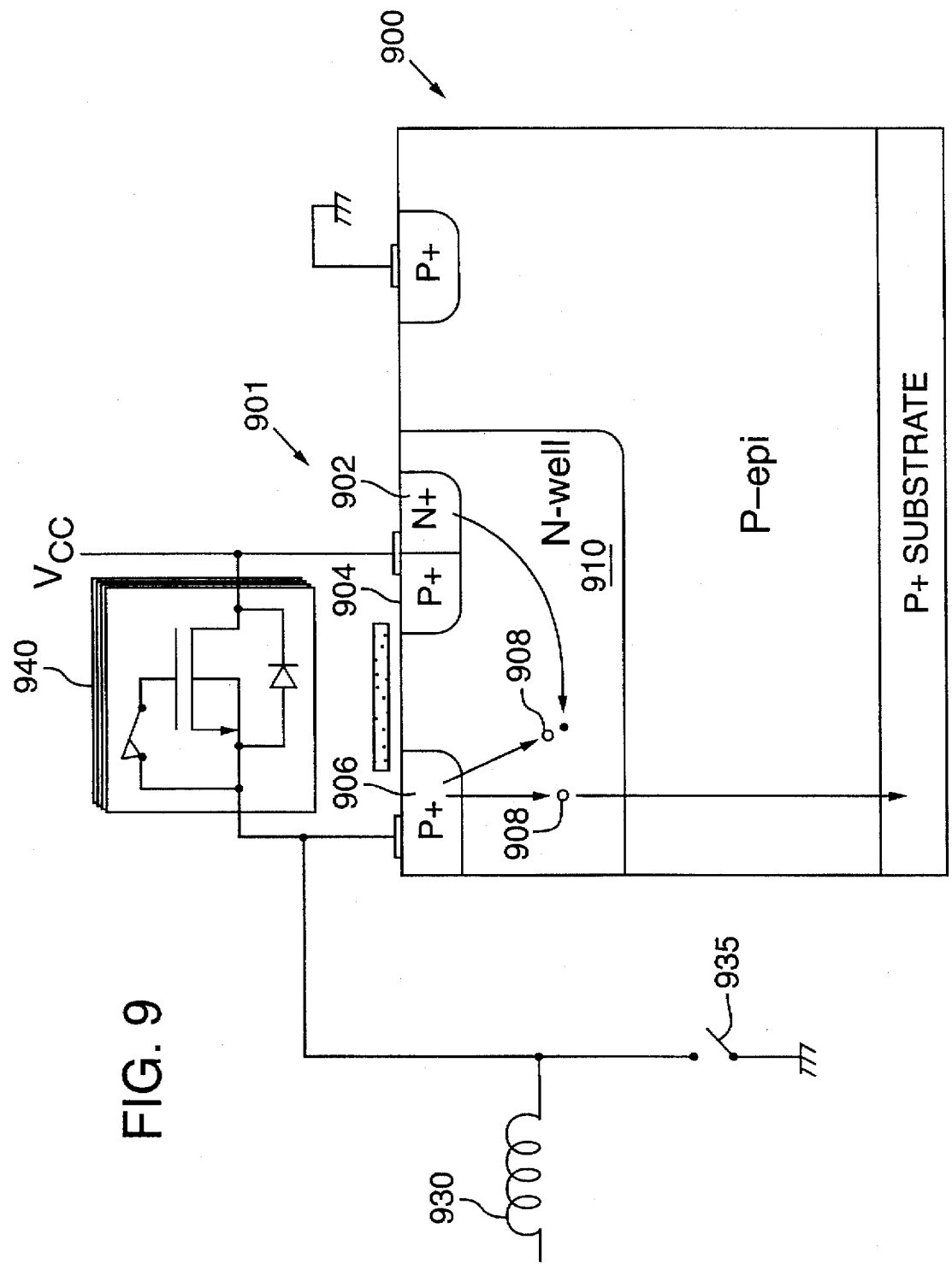
FIG. 9 illustrates a cross-sectional view of an IC showing the use of a pseudo-Schottky synchronous rectifier to prevent snapback of a parasitic PNP bipolar transistor in a P-channel MOSFET.

FIG. 9A illustrates snapback in a P-channel MOSFET 901, which is fabricated in a N-well 910 of an IC 900. The P+ source 904 and N+ body contact 902 are shorted together and tied to $V_{cc}$. The P+ drain 906 is connected to an inductor 930 and a switch 935, which is tied to ground. When the switch 935 is opened, the voltage at the inductor 930 and the drain 906 will fly up above $V_{cc}$. In this situation, the PN diode at the junction between P+ drain 906 and N-well 910 becomes forward-biased, which causes minority carriers in the form of holes 908 to be injected into N-well 910. Furthermore, a parasitic bipolar PNP transistor, formed by the P+ drain 906 acting as the emitter, the N-well 910 acting as the base, and the P+ substrate 914 acting as the collector, has a base-to-collector voltage equal to $V_{cc}$. Therefore, the parasitic PNP transistor will be turned on and will cause the snapback problem illustrated in FIG. 7A.

However, if the voltage at drain 906 were clamped at $V_{cc}$ or below, the parasitic diode will not turn on; and the parasitic PNP transistor will not cause the snapback problem. MOSFET 901 can be clamped with an N-channel pseudo-Schottky synchronous rectifier 940 configured with its cathode connected to $V_{cc}$ and its anode connected to P+ drain 906. With pseudo-Schottky synchronous rectifier 940 in place when the switch 935 is opened and the inductor 930 pulls the drain 906 above $V_{cc}$, pseudo-Schottky synchronous rectifier 940 will conduct current before the parasitic PN diode turns on and clamp drain 906 at $V_{cc}$. Alternatively, a P-channel pseudo-Schottky synchronous rectifier can be used in parallel with the MOSFET 901, or MOSFET 901 can be adjusted to exhibit the pseudo-Schottky effect itself. The gate of pseudo-Schottky synchronous rectifier 940 can be controlled independently so long as it becomes electrically biased to its source during diode conduction.

FIG. 10 illustrates a latchup condition that can occur in an integrated circuit 1000 which contains an N-channel MOSFET 1010 and a N-well 1020. An inductor 1040 is connected to the N+ drain 1011 of MOSFET 1010. The N+ source 1012 and P-epitaxial layer 1013 of the MOSFET 1010 are tied to ground. In certain situations the inductor 1040 can pull the N+ drain 1011 below ground and thus forward-bias the parasitic diode formed by the P-epitaxial layer 1013 and N+ drain 1011. Therefore, the drain 1011 will inject minority carriers in the form of electrons 1014 into the substrate. These electrons 1014 will recombine with holes 1016. However since the holes 1016 are traveling through P type material, the holes will encounter resistance 1015. Therefore, the current caused by the movement of the holes 1016 will create a resistive voltage drop (V=IR) in the P-epi layer 1013 and P+ substrate.

The IR drop will in turn cause any grounded N+ region, such as source 1012, to be more negative than the surrounding P type material. Therefore the parasitic diode 1017, formed by the source 1012 and P-epi layer 1013, becomes forward-biased and injects minority carrier in the form of electrons 1018 of its own. These electrons 1018 may be collected by any N type material, where they will drift to the most positive potential that they can find. For example the electrons 1018 can be swept into the N-well 1020 and drift to the N+ region 1025 connected to $V_{cc}$. However, once the electrons 1018 enter the N-well, they become majority carriers and will thus create a voltage drop that may forward-bias parasitic diode 1028, formed by the N-well 1020 and a P+ region 1027, which represents any P+ region in the IC chip (such as a P+ region associated with a PMOSFET). P+ region 1027 will then inject holes 1029 which can be collected by the P+ epi layer 1013. The presence of holes 1029 fortifies the forward biasing of the parasitic diode 1017, which causes the injection of electrons 1018. As mentioned above, electrons 1018 were the cause of the forward biasing of parasitic diode 1028. Therefore, even if the inductor 1040 were to return to ground or higher the parasitic diodes 1017 and 1028 would remain forward-biased and continue to conduct current with very low voltage drop, thus exhibiting the latchup condition illustrated in FIG. 7B.

Since the initial cause of the latchup condition was the injection of electrons 1014 into the substrate, the problem can be prevented by connecting the cathode of a pseudo-Schottky synchronous rectifier 1050 to N+ drain 1011 and connecting the anode of the pseudo-Schottky synchronous rectifier to ground. In this case, when the inductor 1040 drives the drain 1011 below ground, pseudo-Schottky synchronous rectifier 1050 will shunt the electrons to ground, since pseudo-Schottky synchronous rectifier 1050 has a lower turn-on voltage than the parasitic PN diode formed by the junction of N+ drain 1011 and P-epi layer 1013. Without the electrons 1014 to forward-bias parasitic diode 1017, the latchup condition will not occur. Pseudo-Schottky synchronous rectifier 1050 may be a separate N-channel MOSFET or may be merged into all or a portion of MOSFET 1010 so long as the gate is shorted to the source during diode conduction.

Another major use of the pseudo-Schottky synchronous rectifier is in power converters. Various power converter topologies are built around the relationships between a power source, an inductor, a load, and switches and diodes. In such topologies, the diodes are switched between being forward- and reverse-biased. As mentioned above, a PN diode is a minority carrier device and will store minority carriers when it is forward-biased. When the diode is switched to reverse-bias, the stored charge can cause a long recovery time and large dv/dt.

In cases when a PN diode is allowed to conduct current in the forward direction, the manner in which it turns off is affected by the quantity of charge stored at its PN junction while it was conducting. When the diode is operating in steady-state forward conduction, the quantity of stored charge is proportional to the forward biased conduction current; the higher the forward bias, the greater the quantity of stored charge which must be depleted at turn-off. Therefore, the quantity of stored charge can be reduced by limiting the voltage drop across the diode when it is conducting current in the forward direction. Lowering the voltage drop across a conducting PN diode also reduces the power consumed and heat generated by the diode.

Figure 22A:
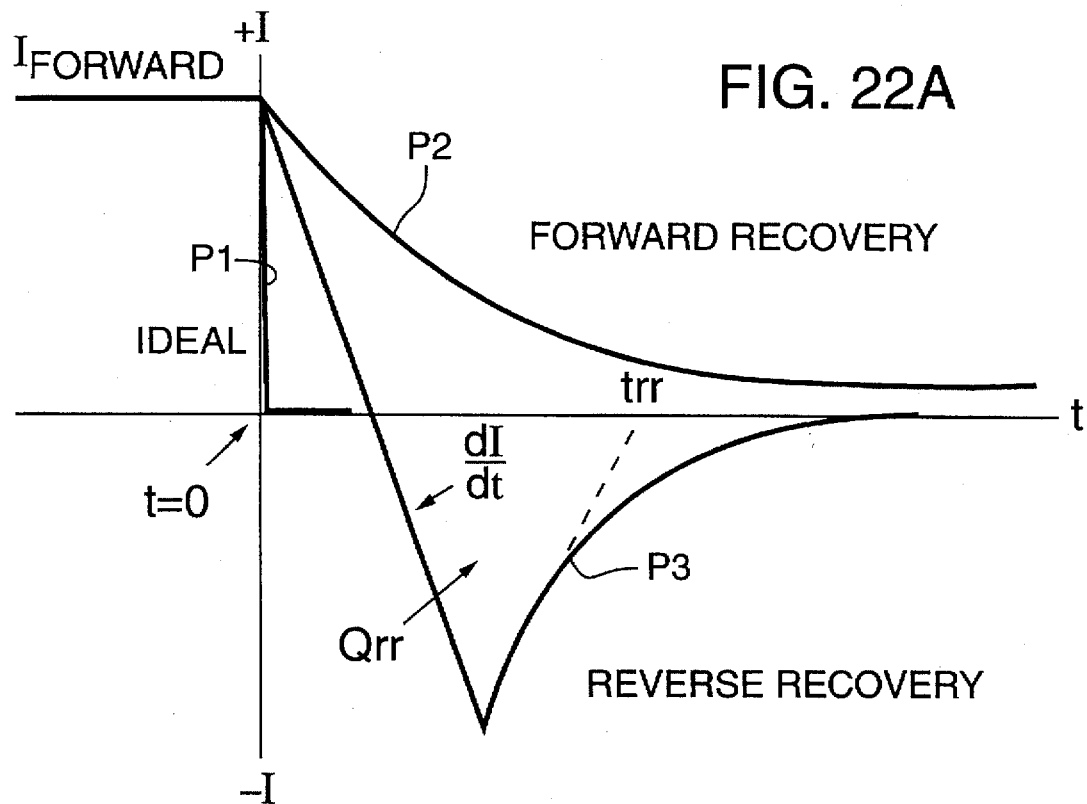
FIGS. 22A and 22B illustrate graphs showing the voltage and current waveforms in a synchronous rectifier during the recovery period following various types of switching.

FIG. 22A illustrates a plot of current (I) versus time (t) during the turn-off of a conventional PN diode, turn-off occurring at a time t=0. Curve P1 illustrates the ideal, with the current falling almost instantly from its steady-state forward level ($I_{forward}$) to zero at t=0. Two scenarios are illustrated. Curve P2 shows what happens if the terminals of the diode are shorted. In this situation, the stored charge slows the turn-off. Curve P3 shows what happens if polarity of the voltage across the diode is suddenly reversed by applying a voltage $V_{DD}$. The turn-off is accelerated somewhat, but at a penalty in behavior and performance. First the current is driven toward zero at a slope dI/dt, but because some of the stored charge is still present when the current reaches zero, the current reverses polarity. As a result, current is pulled in a direction opposite to the direction of $I_{forward}$. Eventually, the current reaches a peak reverse value, and then it decays back to zero exponentially.

This turn-off scenario is therefore limited by diffusion. In FIG. 22A, where the dashed line reaches I=0 gives an estimate of where the actual current is at a level equal to about 10% of the peak reverse current. This time is designated $t_{rr}$, and the area under the curve P3 to this point is designated as $Q_{rr}$. The reverse current shown by curve P3 is thus a non-ideal consequence of the storage of charge at the junction of a PN diode during forward conduction. It can interact adversely with other components in an IC and can cause added losses in a power converter.

Figure 22B:
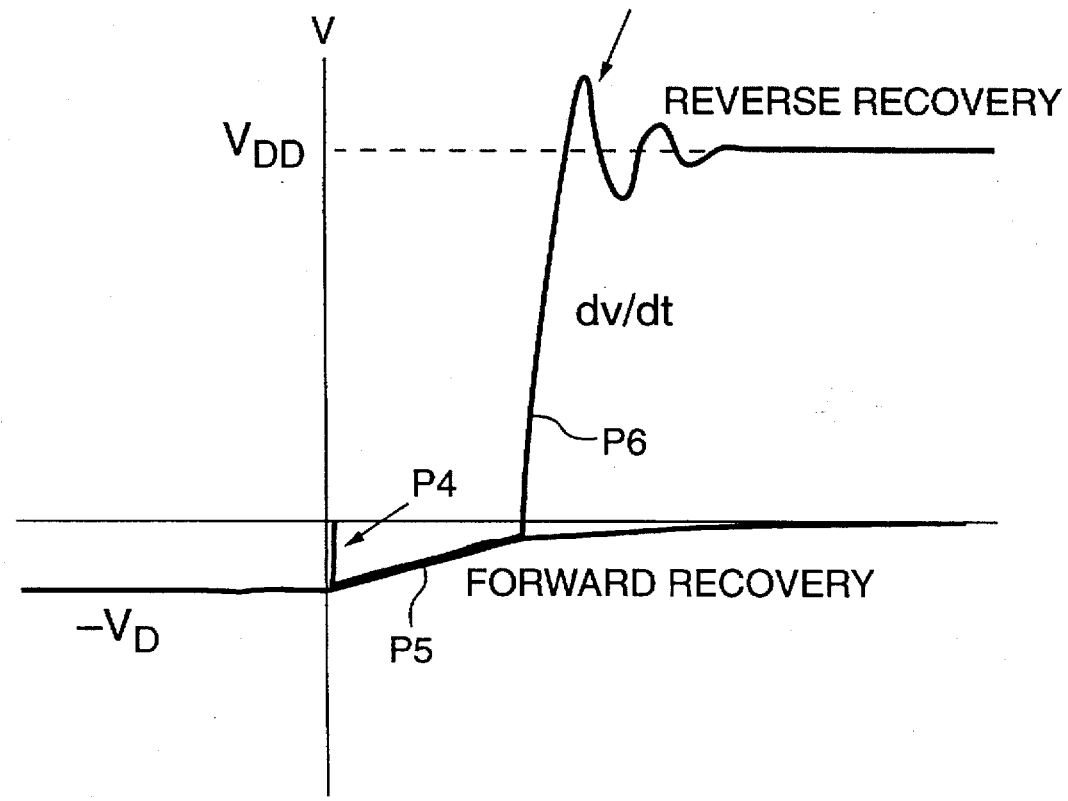

Another aspect of the stored charge is shown in FIG. 22B, which is a plot of the voltage (V) versus time. Curve P4 shows the ideal, with the voltage drop across the diode during forward conduction ($-V_D$) falling to zero at time t=0, limited only by its own resistance and depletion capacitance. In reality, because of the stored minority carriers, the process takes longer. Curve P5 corresponds to curve P2 in FIG. 22A and shows that the voltage across the diode decays exponentially from $-V_D$ when the terminals of the diode are shorted. Curve P6 corresponds to curve P3 in FIG. 22A and shows that, when the diode is reverse-biased with a voltage $V_D$, the voltage across the diode decays slightly (roughly along the same path as curve P5) until most of the stored charge near the junction is removed. Then the voltage rises very rapidly at a rate dV/dt to the reverse voltage $V_{DD}$. The displacement current may increase power losses and induce parasitic interactions in ICs, and if the turn-off is too rapid (i.e., snappy) the voltage may overshoot $V_{DD}$ as a result of parasitic inductance. This may lead to breakdown in the devices or in other devices. An increase in noise, both through conduction and electromagnetic radiation, may also result.

In summary, the charge stored near the junction of a conventional PN diode during forward conduction produces many undesirable effects. These effects can be reduced by using a pseudo-Schottky synchronous rectifier in place of or in parallel with the PN diode. A pseudo-Schottky synchronous rectifier can also be used in parallel with any intrinsic PN diode in a MOSFET, or the MOSFET itself can be designed to behave as a pseudo-Schottky synchronous rectifier. In any of these applications, the pseudo-Schottky synchronous rectifier operates to reduce the voltage drop across a forward-biased PN junction. This in turn reduces the forward current across the PN junction and the quantity of charge that is stored near the junction during the period of forward conduction.

Figure 11A:
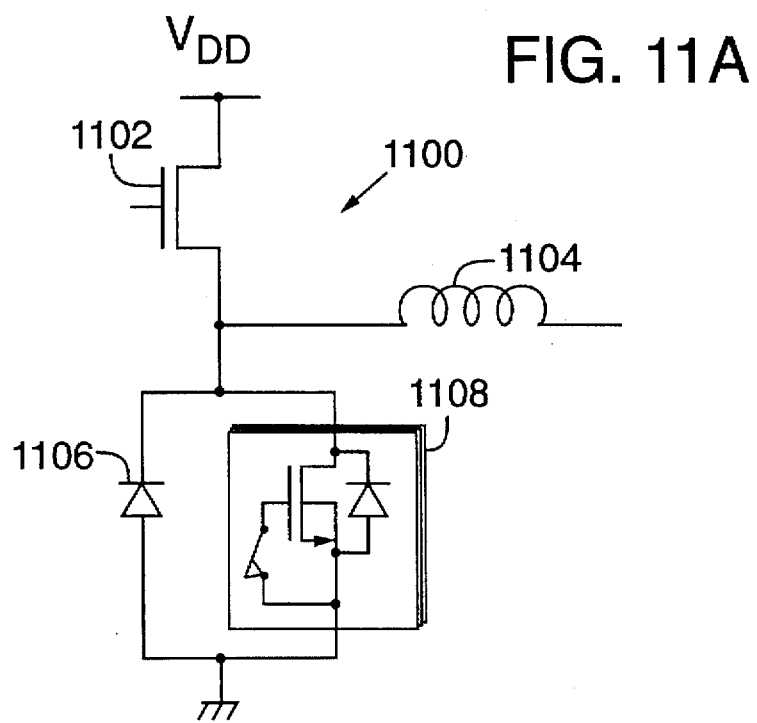
FIGS. 11A–11F illustrate circuit diagrams showing various uses of pseudo-Schottky synchronous rectifiers in power convertors.

FIGS. 11A–11F show several power converter topologies which utilize pseudo-Schottky synchronous rectifiers to minimize minority carrier build up. FIG. 11A shows a buck converter 1100 comprising a high-side switch 1102, an inductor 1104, and a PN diode 1106 in parallel with a pseudo-Schottky synchronous rectifier 1108. Whenever high-side switch 1102 is opened, the inductor 1104 (whose current is constant so long as repeated switching occurs at a high frequency) forces conduction through diode 1106 and parallel pseudo-Schottky synchronous rectifier 1108. The diode handling the recirculating current is known as the rectifier. At some later interval the gate of pseudo-Schottky synchronous rectifier 1108 can be disconnected from its source and biased into its MOSFET state to further reduce power losses. If the gate of pseudo-Schottky synchronous rectifier 1108 is driven with sufficient voltage and pseudo-Schottky synchronous rectifier 1108 is sufficiently large to handle the entire inductor current under worst case conditions, then the converter can be referred to as a synchronous buck converter. If diode 1106 is eliminated, then the diode within pseudo-Schottky synchronous rectifier 1108 must carry the full current during the time that both the high-side switch 1102 and pseudo-Schottky synchronous rectifier 1108 are off. If the pseudo-Schottky effect is pronounced, this current can be conducted without a large amount of stored charge.

Figure 11B:
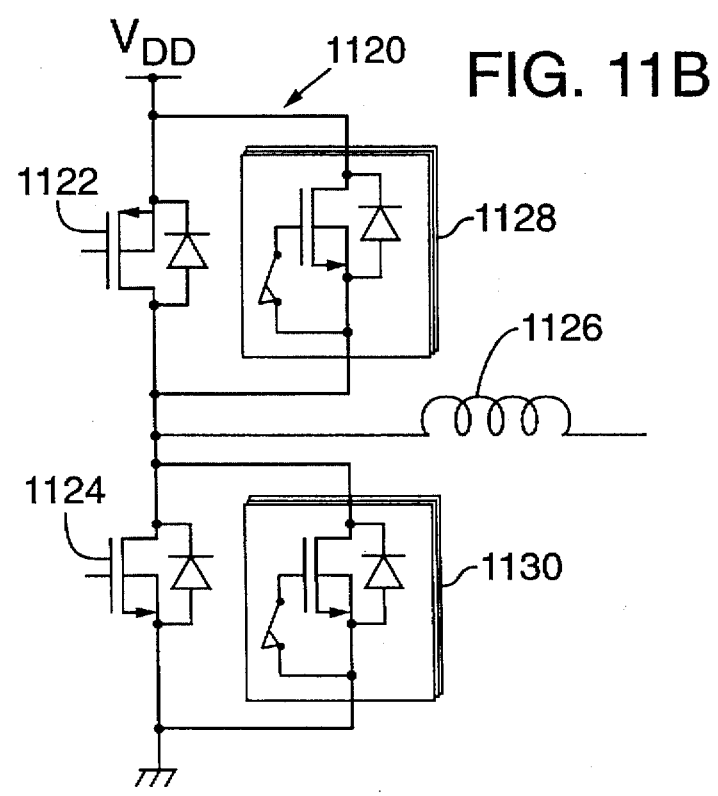

FIG. 11B shows a synchronous buck converter 1120 comprising a P-channel MOSFET 1122 in parallel with a pseudo-Schottky synchronous rectifier 1128, an inductor 1126, and an N-channel MOSFET 1124 acting as the rectifier in parallel with a pseudo-Schottky synchronous rectifier 1130. During operation of the synchronous buck converter 1120, the P-channel MOSFET 1122 and the N-channel MOSFET 1124 are turned on off alternately, MOSFET 1122 being off when MOSFET 1124 is on and vice-versa. There is a brief "break-before-make" interval, however, when both MOSFETs are turned off, i.e., one of the MOSFETs must be turned off before the other is turned on to avoid a short between $V_{dd}$ and ground. During this interval, the switching of inductor 1126 will cause one of the parasitic diodes of the two MOSFETS will be forward-biased. The presence of pseudo-Schottky synchronous rectifiers 1128 and 1130 will shunt current around the parasitic diodes and thus minimize any minority carrier build up while they are forward-biased. Ideally, pseudo-Schottky synchronous rectifier 1128 is not needed except to clamp overshoot during the turn-off of low-side MOSFET 1124 during any diode recovery. Pseudo-Schottky synchronous rectifier 1130 may in fact constitute a portion or all of MOSFET 1124 provided that its gate is shorted to its source during polarity reversal.

Figure 11C:
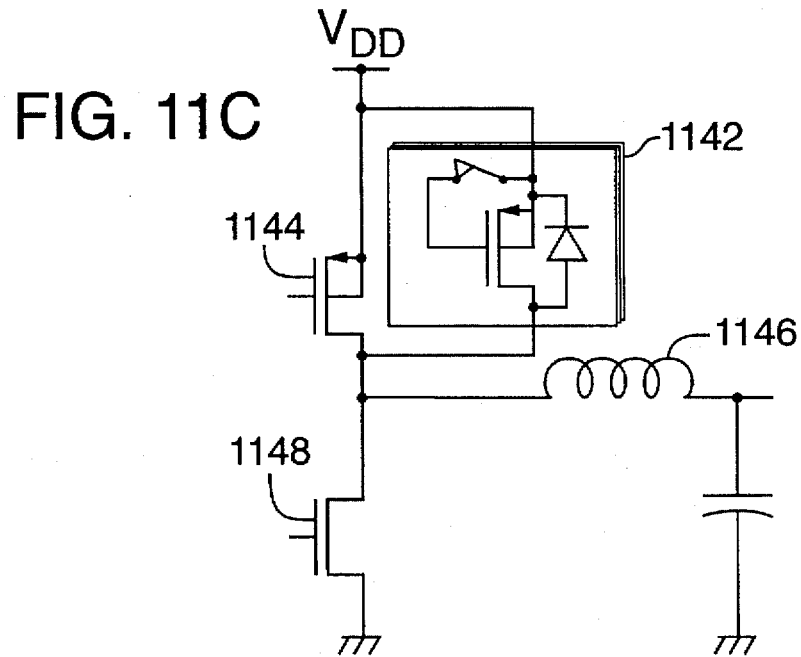

FIG. 11C illustrates a buck converter which includes a P-channel MOSFET 1144 acting as the high side switch and connected in parallel with a P-channel pseudo-Schottky synchronous rectifier 1142 in place of the N-channel pseudo-Schottky synchronous rectifier 1128 shown in FIG. 11B, thereby facilitating integration of the circuit.

Figure 11D:
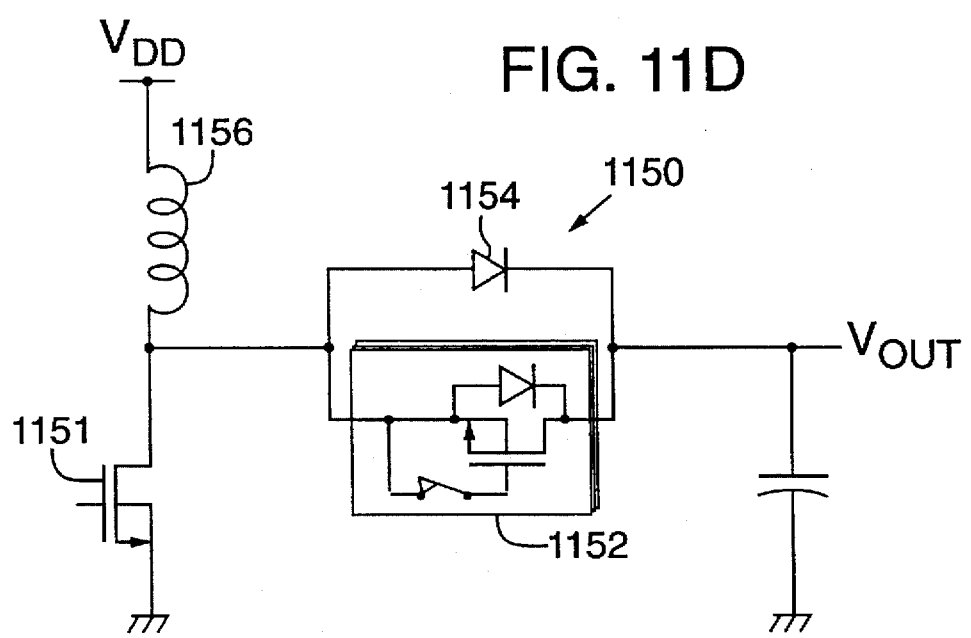

FIG. 11D shows a boost converter 1150 which has a pseudo-Schottky synchronous rectifier 1152 in parallel with a rectifier diode 1154. In the operation of converter 1150, the low-side switch 1151 is turned on so as to store energy in inductor 1156. Low-side switch 1151 is then turned off, causing the voltage at the drain of switch 1151 to fly above $V_{out}$, thereby forward-biasing diode 1154. Feedback controls the "on" time of switch 1151 to hold $V_{out}$ constant. Pseudo-Schottky synchronous rectifier 1152 shunts current from diode 1154, reducing power losses and preventing forced diode recovery (i.e., the application of a reverse voltage to a diode which has charge stored from a previous forward conduction). Pseudo-Schottky synchronous rectifier 1152 may be turned fully on by biasing its gate at least 3 V above $V_{out}$ following the break-before-make interval. If a P-channel device is used for pseudo-Schottky synchronous rectifier 1152, the PMOS device could be turned on by bringing its gate to ground (MOSFET mode). By optimizing the pseudo-Schottky effect, the device can conduct in the pseudo-Schottky mode simply by returning its gate to its source.

Figure 11E:
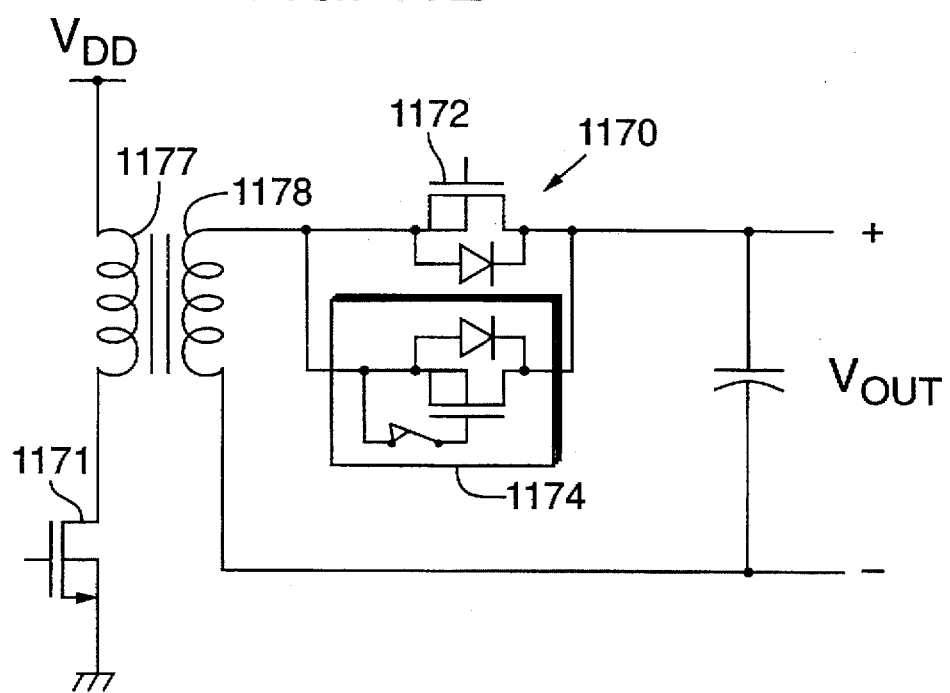

FIG. 11E shows flyback converter 1170 with a MOSFET 1172 acting as a synchronous rectifier in parallel with a pseudo-Schottky synchronous rectifier 1174. As in the boost converter shown in FIG. 11D, low-side MOSFET 1171 is turned on to energize primary coil 1177. The turns in primary coil 1177 and secondary coil 1178 are oriented such that in this condition the intrinsic anti-parallel diodes in MOSFET 1172 and pseudo-Schottky synchronous rectifier 1174 are reverse-biased and do not conduct current. MOSFETs 1171 and 1172 cannot be switched simultaneously because this would cause a "shoot through" current which would discharge the output capacitor. Accordingly, there is a "break-before-make" interval between the turn-off of MOSFET 1171 and the turn-on of MOSFET 1172. During this interval, current flows in the forward direction through pseudo-Schottky synchronous rectifier 1174 until the channel of MOSFET 1172 is turned on. It is this forward current that charges the output capacitor. Power losses are reduced during the break-before-make interval by shunting through pseudo-Schottky synchronous rectifier 1174 the current that would otherwise flow through the intrinsic anti-parallel diode of MOSFET 1172. Pseudo-Schottky synchronous rectifier 1174 could be controlled by an independent gate drive provided that $V_{SB}=0$ during the break-before-make interval, or it could be integrated into MOSFET 1172.

Figure 11F:
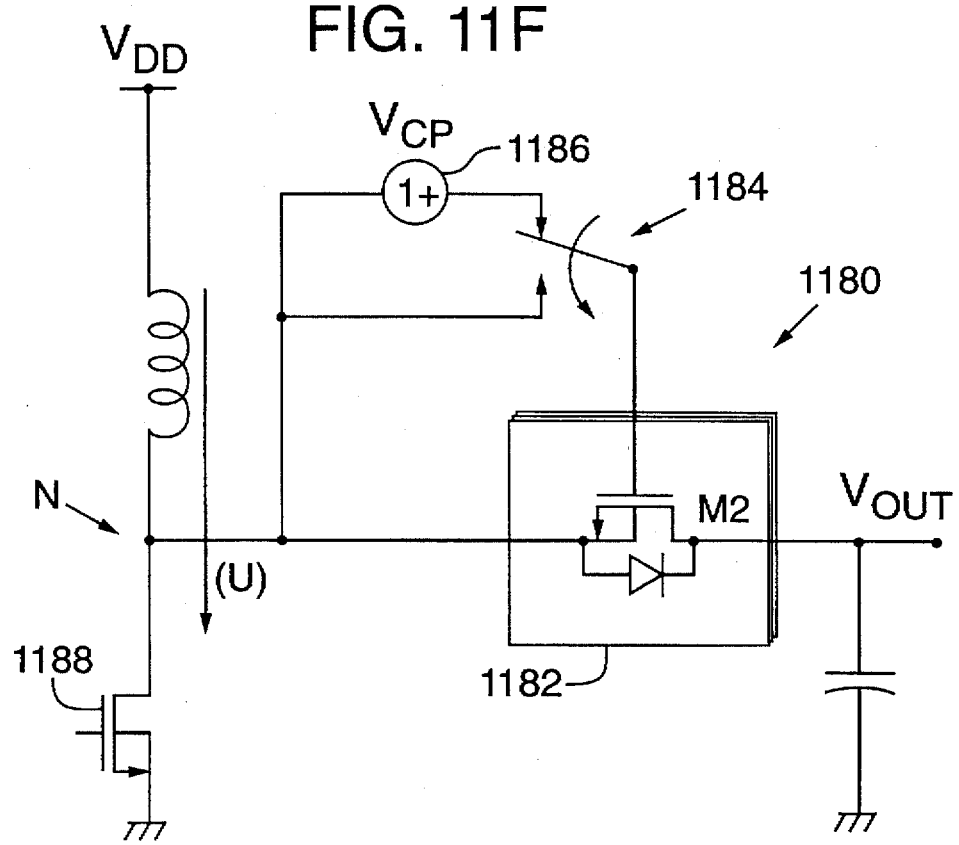

FIG. 11F illustrates a circuit diagram of a circuit which includes a pseudo-Schottky synchronous rectifier 1182 which is employed in accordance with a preferred embodiment of this invention. Switching-mode boost converter 1180 includes a switch 1184 which alternately connects the gate of pseudo-Schottky synchronous rectifier 1182 to either the source of pseudo-Schottky synchronous rectifier 1182 or a positive voltage $V_{cp}$ supplied by a charge pump 1186. A low-side MOSFET 1188 acts as a shunt switch. While low-side MOSFET 1188 is turned on, pseudo-Schottky synchronous rectifier 1182 is in its pseudo-Schottky state, and switch 1184 ties the gate and source of pseudo-Schottky synchronous rectifier 1182 together. Since at this time $V_{out}$ is higher than the voltage at node N, the channel in pseudo-Schottky synchronous rectifier 1182 is turned off and the intrinsic anti-parallel diode within pseudo-Schottky synchronous rectifier 1182 is reverse-biased.

In the break-before-make interval between the turn-off of MOSFET 1188 and the turn-on of pseudo-Schottky synchronous rectifier 1182, the voltage at node N begins to fly up. During this interval, since the gate and source of pseudo-Schottky synchronous rectifier 1182 remain tied together, pseudo-Schottky synchronous rectifier 1182 exhibits the pseudo-Schottky effect and a current flows through the channel of pseudo-Schottky synchronous rectifier 1182, which constitutes a relatively low resistance path as compared to the path through the anti-parallel diode of pseudo-Schottky synchronous rectifier 1182. The break-before-make interval ends when switch 1184 connects the gate of pseudo-Schottky synchronous rectifier 1182 to the voltage $V_{cp}$ supplied by charge pump 1186, thereby turning pseudo-Schottky synchronous rectifier 1182 fully on and providing a path for current to flow from node N towards the output terminal (MOSFET state). With this arrangement, the IV power loss in pseudo-Schottky synchronous rectifier 1182 during the break-before-make interval is significantly less than would occur if, for example, the gate of pseudo-Schottky synchronous rectifier 1182 were grounded and the current flowed entirely through its anti-parallel diode.

Similarly, a pseudo-Schottky synchronous rectifier can be used in other types of converters, such as forward converters, where the pseudo-Schottky diode can be connected so as to shunt or replace a forward-conducting diode.

Figure 12A:
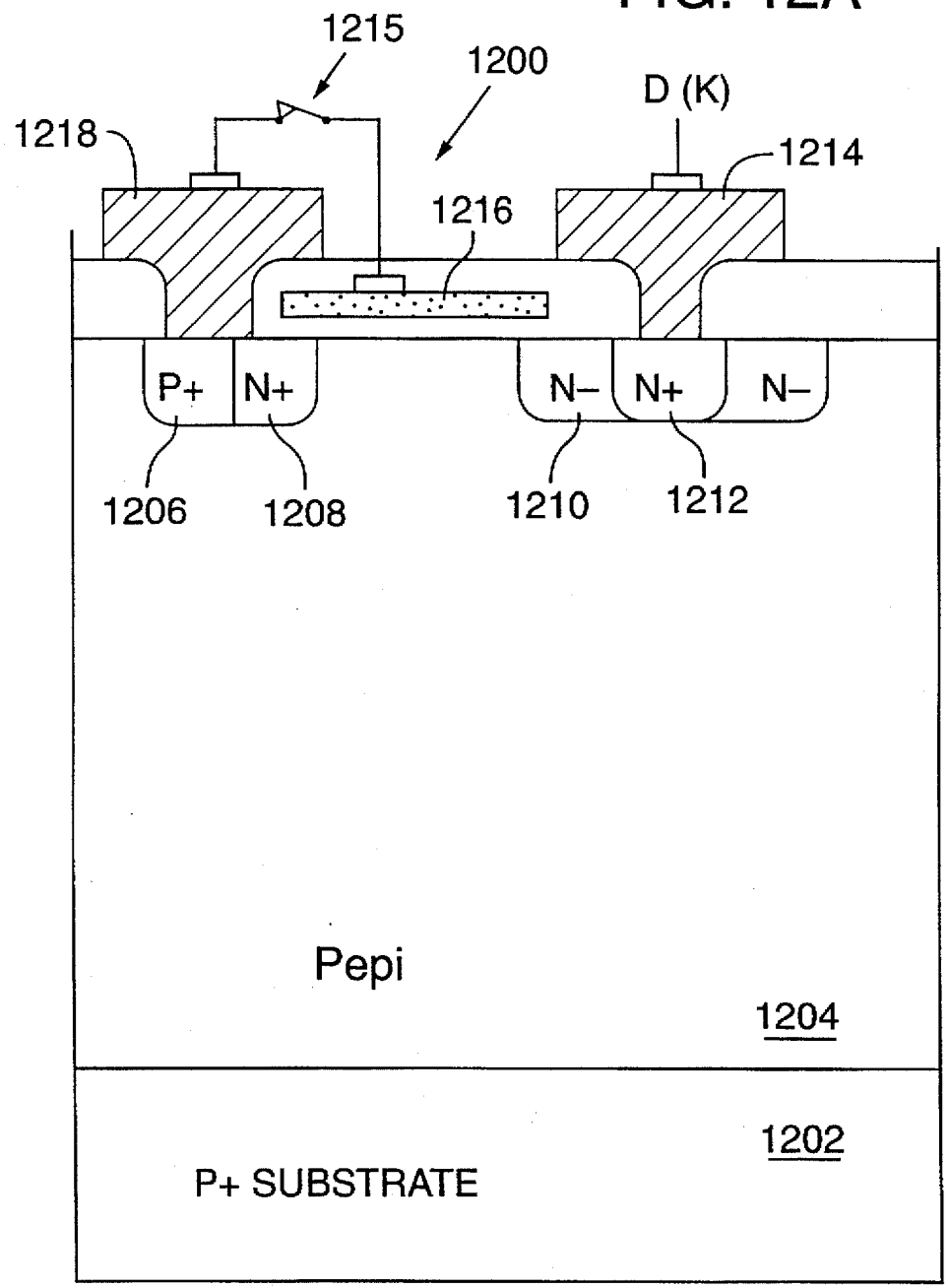
FIGS. 12A–12C illustrate cross-sectional views showing three implementations of a pseudo-Schottky synchronous rectifier in integrated form.
Figure 12B:
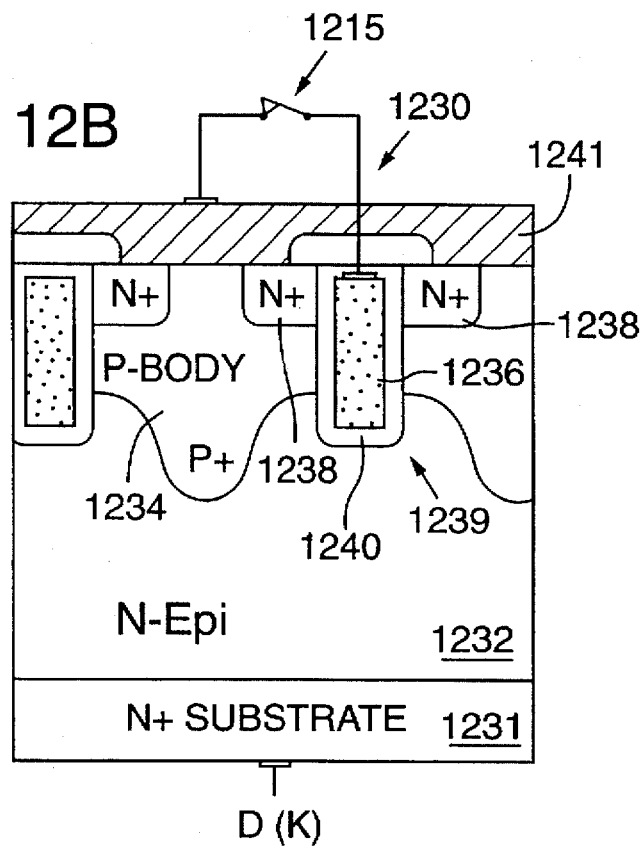
Figure 12C:
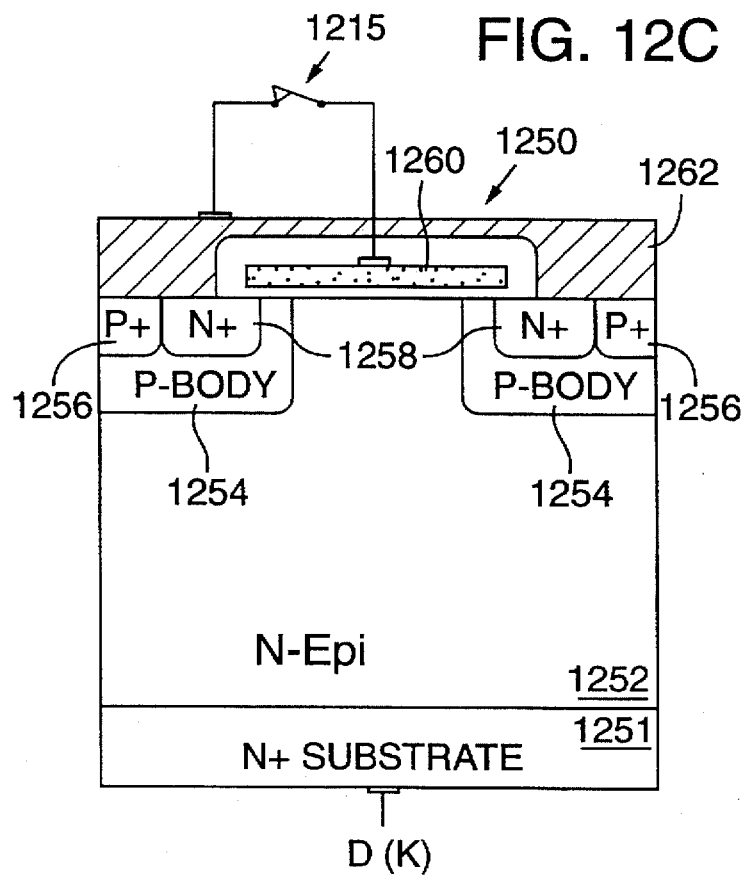

FIGS. 12A-12C illustrate cross-sectional views showing the structure of several embodiments of a pseudo-Schottky synchronous rectifier. FIG. 12A shows in cross-section an embodiment of a pseudo-Schottky synchronous rectifier 1200 formed in a lateral configuration. An P-epitaxial layer 1204 is grown upon a P+ substrate 1202 using conventional techniques. A P+ body contact 1206 and an N+ source 1208 are shorted by a metal source/body contact 1218. A gate 1216 is connected to the source/body contact 1218 through a switch 1215. A metal drain contact 1214 connects to the N+ drain 1212. An N- drift region 1210 is located adjacent N+ drain 1212. When switch 1215 is opened, gate 1216 is connected to a positive voltage source (not shown) which biases pseudo-Schottky synchronous rectifier 1200 into its MOSFET state.

FIG. 12B shows a pseudo-Schottky synchronous rectifier formed in a vertical trenched-gate configuration. The N+ substrate 1231 forms the drain of the MOSFET. An N-epitaxial layer 1232 is grown on n+to substrate 123. A P-body region 1234 is implanted in N-epitaxial layer 1232. N+ source regions 1238 are implanted into P-body region 1234. A trench 1239 is then etched through the source and body regions and into the N-epitaxial layer 1232. The trench is filled with a gate 1236 which is separated from the N+ source 1238, P-body 1234, and N-epitaxial layer 1232 by a gate oxide layer 1240. A metal layer 1241 shorts the P-body and N+ source regions and is also connected to the gate 1236 through a switch 1235. When switch 1235 is opened, gate 1236 is connected to a positive voltage source (not shown) which biases pseudo-Schottky synchronous rectifier 1230 into its MOSFET state.

FIG. 12C shows a pseudo-Schottky synchronous rectifier 1250 formed in a vertical double-diffused (DMOS) configuration. An N+ substrate 1251 acts as the drain of the MOSFET. An N-epitaxial layer 1252 is grown on the surface of the substrate 1251. P-body regions 1254 are implanted and diffused into the top surface of the N-epitaxial layer 1252. P+ body contact regions 1256 and N+ source regions 1258 are implanted and diffused into the P-body regions 1254. A gate 1260 overlies channel regions within P-body regions 1254. P+ body contact regions 1256 and N+ source regions 1256 are shorted together by a metal layer 1262 and are connected to gate 1260 by a switch 1255. When switch 1255 is opened, gate 1260 is connected to a positive voltage source (not shown) which biases pseudo-Schottky synchronous rectifier 1250 into its MOSFET state.

In each of the embodiments shown in FIGS. 12A–12C, the doping concentrations and the gate oxide thickness are chosen so as to amplify the pseudo-Schottky effect. A threshold adjust implant will normally be required. The gate is driven independently but is connected to the source and body when the pseudo-Schottky synchronous rectifier is in its pseudo-Schottky state, e.g., in the break-before-make intervals in the power converters shown in FIGS. 11A–11.

Figure 13:
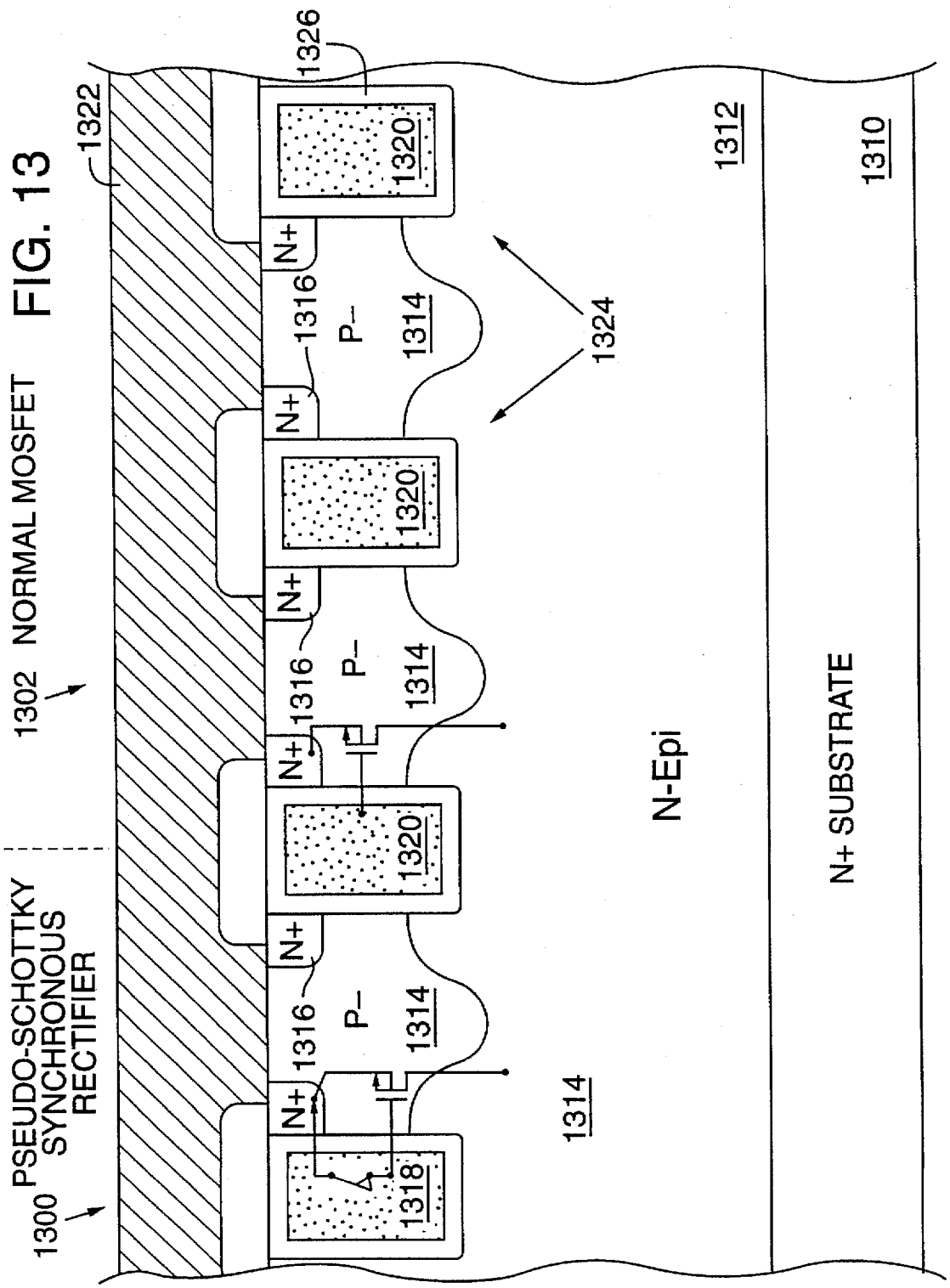
FIG. 13 shows a cross-sectional view of a pseudo-Schottky synchronous rectifier (with the source-gate connection shown symbolically), merged with an active MOSFET is also capable of pseudo-Schottky operation.

FIG. 13 shows a cross-sectional view of a pseudo-Schottky synchronous rectifier 1300 in combination with a MOSFET 1302. An N-epitaxial layer 1312 is grown on an N+ substrate 1310. A P-body region 1314 is implanted into the N-epitaxial layer 1312. N+ source regions 1316 are implanted into the P-body region 1314. Trenches 1324 are then etched through the N+ source regions 1316 and P-body region 1314 and into the N-epitaxial layer 1312. The trenches 1324 are filled with a first gate 1318 or a second gate 1320, both of which are separated from N+ source regions 1316, P-body region 1314, and N-epitaxial layer 1312 by an oxide layer 1326. A metal layer 1322 contacts the P-body region 1314 and N+ source regions 1316, and is also connected through a switch 1315 to gate 1318. With the structure shown in FIG. 13, if the N+ source regions become biased positively with respect to the N+ substrate (drain) while switch 1315 is closed, pseudo-Schottky synchronous rectifier 1300 conducts and minimizes the storage of charge at the body-drain junction of MOSFET 1302. With pseudo-Schottky synchronous rectifier 1300 used as a clamp in this way, current is instantaneously redistributed to pseudo-Schottky synchronous rectifier 1300 when it is forward-biased. In this structure, however, the conventional MOSFET may or may not be made in accordance with the pseudo-Schottky method. In order to exhibit a greater pseudo-Schottky effect, the gate of MOSFET 1302 should be electrically tied to the source during any time period in which the PN diode formed by P-body region 1314 and N-epitaxial layer 1312 is forward-biased.

Design Criteria

Since some of the same considerations apply in the design of a pseudo-Schottky diode and a pseudo-Schottky synchronous rectifier, the design criteria for a pseudo-Schottky diode will be described initially.

In designing a pseudo-Schottky diode, the turn-on voltage of the pseudo-Schottky diode ($V_{PS}$) should be minimized relative to the turn-on voltage of the PN diode that is to be shunted.

A two-terminal pseudo-Schottky diode can be characterized as a MOSFET wherein $V_{gs}=V_{bs}=V_{ds}$, where $V_{gs}$ is the gate-to-source voltage, $V_{bs}$ is the body-to-source voltage, and $V_{ds}$ is the drain-to-source voltage. The equation for the drain current ($I_d$) for a saturated MOSFET is given as:

$$I_{D_{sat}} = \frac{\mu C_{ox}}{2} \frac{W}{L} (V_{gs} - V_t)^2$$

where $\mu$ is the carrier surface mobility (cm$^2$/Vsec), $C_{ox}$ is the capacitance of the gate oxide layer (F/cm$^2$), W and L are the channel width and length, respectively. $V_t$, the threshold voltage of the MOSFET, can be expressed as:

$$V_t = V_{t_0} + \gamma(\sqrt{|V_{sb} + \Psi_B|} - \sqrt{\Psi_B})$$

where $V_{t_0}$ is the extrapolated threshold voltage (i.e., the voltage where the MOSFET current extrapolates to zero), $\gamma$ is the body effect factor (V$^{-\frac{1}{2}}$), and $\psi_B$ is the bulk voltage (i.e., the voltage needed to bend the energy bands in the silicon body region, often assumed to be twice the Fermi potential $$\psi_B = 2\phi_f = 2\frac{kT}{q} \ln\frac{N_B}{n_i}$$

but actually somewhat larger in a strong inversion (typically 0.65–0.8 V)) as given by:

$$\psi_B = 2\phi_f + 6\frac{kt}{q} = 2\frac{kT}{q}\left(\ln\frac{N_B}{n_i} + 3\right)$$

Combining the equations for $I_{Dsat}$ and $V_t$ gives the drain current as:

$$I_{D_{sat}} = \frac{\mu C_{ox}}{2} \frac{W}{L} \{V_{gs} - [V_{t_0} + \gamma(\sqrt{|V_{sb} + \Psi_B|} - \sqrt{\Psi_B})]\}^2$$

Since $V_{gs}=V_{bs}=V_{ds}$ in a pseudo-Schottky diode, we can substitute $V_{ps}$ for $V_{gs}$, $V_{bs}$, and $V_{ds}$ to obtain the current equation of a pseudo-Schottky diode:

$$\frac{I_{D_{sat}}}{W} = \frac{\mu C_{ox}}{2L} \{V_{PS} - [V_{t_0} + \gamma(\sqrt{|-V_{PS} + \Psi_B|} - \sqrt{\Psi_B})]\}^2$$

which can be rewritten as:

$$V_{PS} = V_{t_0} - \gamma(\sqrt{\Psi_B} - \sqrt{|\Psi_B - V_{PS}|}) + \sqrt{\frac{2L}{\mu C_{ox}} \cdot \frac{I_{Dsat}}{W}}$$

$C_{ox}$, the capacitance of the oxide layer, can be expressed as $X_{ox}/\epsilon_{ox}$, where $X_{ox}$ is the gate oxide thickness and $\epsilon_{ox}$ is the permittivity of silicon dioxide. The body effect factor $\gamma$ is given by:

$$\gamma = (\sqrt{2q\epsilon_s N_B}) \frac{X_{ox}}{\epsilon_{ox}}$$

where $N_B$ is the dopant concentration in the body region and $\epsilon_s$ is the permittivity of silicon. Therefore we have:

$$V_{PS} = V_{t_0} - \left[ (\sqrt{2q\epsilon_s N_B}) \frac{X_{ox}}{\epsilon_{ox}} (\sqrt{\Psi_B} - \sqrt{|\Psi_B - V_{PS}|}) \right] +$$

$$\sqrt{\frac{2L}{\mu} \cdot \frac{X_{ox}}{\epsilon_{ox}} \cdot \frac{I_{Dsat}}{W}}$$

While the term $V_{t_0}$ also contains the terms $X_{ox}$ and $N_B$, it is assumed here that a threshold adjusting ion implantation is used to adjust the threshold voltage to some target value to compensate for any changes in $X_{ox}$ and $N_B$. Therefore, $V_{t_0}$ can be viewed as an independent variable.

Empirical data have shown that $V_{PS}$ is approximately 0.3 to 0.5 V, since $\psi_B$ is in the range of 0.65 V. Therefore, the second term of the $V_{PS}$ equation is positive but will lower $V_{PS}$ since it is subtracted from the first and third terms of the equation. Since $V_{PS}$ appears in the second term of the equation, to actually determine $V_{PS}$ the equation must be solved with an iterative process until the answer converges. However, the presence of $V_{PS}$ in the second term does not change the relationship that $V_{PS}$ is inversely proportional to the second term. The first and third terms are positive so that raising or lowering their values will lead to corresponding changes of $V_{PS}$. As mentioned above, ideally $V_{PS}$ is as small as possible relative to the parasitic diode turn-on voltage. Without a threshold adjust implantation, $V_{t_0}$ is constrained by other factors and can not be used to control $V_{PS}$. The two variables that can then be most easily adjusted in the equation for $V_{PS}$ are $X_{ox}$ and $N_B$.

Increasing $X_{ox}$ will increase the second term, which would decrease $V_{PS}$ in the second term. However, increasing $X_{ox}$ will also increase the third term which will increase $V_{PS}$. Therefore, the relationship of $V_{PS}$ and $X_{ox}$ involves counteracting effects, and accordingly the use of $X_{ox}$ alone to control $V_{PS}$ is not generally sufficient. Moreover, increasing $X_{ox}$ becomes problematic for a pseudo-Schottky synchronous rectifier, which alternates between its diode and MOSFET states.

Increasing $N_B$ will increase the second term of the equation for $V_{PS}$, which will lower $V_{PS}$. However, $V_{t_0}$ is also increased if $N_B$ is increased. Fortunately, techniques have been developed which use a "threshold adjust" implant to adjust $V_{t_0}$ to a required level after the $N_B$ of the device has been set. The threshold voltage $V_t$ is therefore generally adjusted by ion implantation to a final value in the range of 0.45 to 0.95 V, but generally between 0.6 and 0.7 V (no body effect). These techniques are described in application Ser. No. 07/855,373, filed Mar. 20, 1992, now abandoned, and application Ser. No. 07/854,162, filed Mar. 20, 1992, now abandoned, each of which is incorporated herein by reference in its entirety. Therefore, to minimize $V_{PS}$, $N_B$ should be set to as high a value as possible given other required characteristics of the device such as breakdown voltage. A threshold adjust implant which is too high can lead to mobility denigration and an increase in on-resistance. Further improvement in $V_{PS}$ can be obtained by finding the optimal value of $X_{ox}$ for the given value of $N_B$. For a pseudo-Schottky diode the gate oxide should be a relatively thick, e.g., $X_{ox}$=400–1000 Å or more. On the other hand, if the device is to operate as a pseudo-Schottky synchronous rectifier, the gate oxide must be kept thin to minimize on-resistance.

The low-threshold voltage and simultaneous high body effect (which lowers the threshold voltage in Quadrant III operation) can be achieved by any method where a high concentration region of depth greater than the maximum depletion region from the gate (when inversion occurs) is counterdoped by a thin implanted layer or surface layer which is substantially depleted when the device is biased off. The counterdoping layer results in a shift in the threshold voltage $\Delta V_t$ which is given by:

$$\Delta V_t = \frac{Q_{imp}}{C_{ox}} = \frac{Q_{imp} X_{ox}}{\epsilon_{ox}}$$

For an N-channel device, the threshold adjust implant must be N-type dopant (arsenic or phosphorous) implanted into the silicon surface, or an immobile positive ion such as cesium implanted into the gate oxide. The dosage of the gate oxide charge must be increased if the charge is not located at the interface between the gate oxide and the silicon, e.g., a charge located halfway through the gate oxide requires twice the dosage to obtain the same shift of threshold voltage.

Modifying the threshold voltage equation, the required $V_t$ adjust dose is given by:

$$Q_{imp} = \frac{\epsilon_{ox}}{X_{ox}} \left[ V_{t_0}(\text{target}) - \left( V_{FB} \equiv \psi_B \pm \frac{\sqrt{2q\epsilon_{si}} X_{ox}}{\epsilon_{ox}} \sqrt{N_B} (\sqrt{\psi_B}) \right) \right]$$

where the plus signs are used for N-channel devices and the minus signs are used for P-channel devices, and where $$\psi_B \approx 2\left( \frac{kT}{q} \ln \frac{N_b}{n_i} \right) + 6\frac{kT}{q}$$

and $$V_{FB} = \phi_{ms} - \frac{Q_f}{C_{ox}} = \phi_m - \phi_s - \frac{Q_f X_{ox}}{\epsilon_{ox}}$$

where $\phi_m$ is the work function of the gate material and $\phi_s$ is the work function of the silicon such that $V_{FB}$ defines the so called "flat band" condition (generally a negative number around 0.5 to 1.5 V). The term kT/q is known as the thermal voltage (around 26 mV at room temperature) where k is Boltzmann's constant. The term $n_i$ is the intrinsic carrier concentration of silicon, having a value around $1.4\times10^{10}$ cm$^{-3}$ at room temperature. $Q_f$ is the fixed oxide charge, around $2\times10^{10}$ cm$^{-2}$.

FIG. 16 illustrates the challenges in developing a simple analytic model of the pseudo-Schottky effect present in any pseudo-Schottky diode or synchronous rectifier. The gate width normalized current (I/W) is plotted as a function of $V_{gs}$ for the threshold connected configuration (FIG. 1B) and the pseudo-Schottky configuration, assuming both a strong inversion model and a weak inversion model. Curves P7 and P8 represent the weak inversion model of the pseudo-Schottky and threshold-connected configurations, respectively; curves P9 and P10 represent the strong inversion model of the pseudo-Schottky and threshold-connected configurations, respectively. The previous equations are derived under the assumption that the silicon surface of an on-state MOSFET is strongly inverted. In such a model, the gate width normalized current falls precipitously near the threshold. Even so, the strong inversion equation can be used to predict the influence of the body effect in lowering $V_t$ when in Quadrant III. Also in FIG. 16 curve P11 plots the value of $V_t$ for the pseudo-Schottky diode as a function of $V_{sb}$ (which is the same as $-V_{gs}$). At lower currents and voltages, the drain current varies exponentially with gate voltage. This region of operation is known as weak inversion, where the diffusion (rather than drift) current dominates. The conduction can be thought of as a gate-induced barrier lowering of the built-in source to body energy barrier.

The normalized current for the weak inversion model is defined as follows:

$$\frac{I}{W} = \frac{\mu C_{ox} \gamma \left(\frac{kT}{q}\right)^2 e^{\frac{\psi_{sc}(V_{gb}) - 2\Phi_f}{\left(\frac{kT}{q}\right)}}}{2L\sqrt{\psi_{sc}(V_{gb})}} \left(e^{\left(\frac{-V_{sb}}{\frac{kT}{q}}\right)} - e^{\left(\frac{-V_{sb}}{\frac{kT}{q}}\right)}\right)$$

where $\gamma$ is the previously defined body effect factor, kT/q is the 26 mV thermal voltage, and the surface potential is now less than in strong inversion such that $$\psi_{sc}(V_{gb}) \equiv \left(-\frac{\gamma}{2} + \sqrt{\frac{\gamma^2}{4} + V_{gb} - V_{FB}}\right)^2$$

Notice that the current varies exponentially with gate voltage (where $V_{gb}=V_{gs}+|V_{sb}|$), making the weak behavior on semilog paper just like the diode equation. Since the equation is based on a barrier-lowering effect, the weakly inverted MOSFET is very much like a diode except that it is a majority carrier device. Since the Schottky diode is a majority carrier device depending on barrier-lowering for conduction, it is appropriate to refer to this MOSFET as a pseudo-Schottky. Note, however, that the weak inversion equation overestimates the current of a normal MOSFET beyond 0.4 V (see curves P7,P8) while the strong inversion equation underestimates the current below 1 V (see curves P9,P10). For a pseudo-Schottky diode, the weak inversion equation is valid up to 0.3 V and the strong inversion equation is valid down to about 0.5 V. These values can be confirmed by comparing the theoretical curves of FIG. 16 with the measured values shown in FIG. 5B. Therefore, 0.5 V pseudo-Schottky voltage is somewhat predicted by the strong inversion equation. A detailed description of the MOS equation themselves is given in *The MOS Transistor*, by Y. Tsividis, McGraw-Hill, New York (1987), ISBN #0-07-065381-X, particularly Chapter 4, but without any suggestion of the pseudo-Schottky phenomenon or the optimization thereof. According to the text, the region between strong and weak inversion is not easily modeled and relies on complex and numerically noisy iterative solutions. Unfortunately, it is this region where the pseudo-Schottky effect is most pronounced. If one plots the ratio of the values represented by the curves PS and PN in FIG. 5B against $V_{ds}$, the peak ratio of nearly 800 is evident at around 0.4 to 0.5 V. Nonetheless, the strong inversion equations can be used to optimize the pseudo-Schottky effect.

FIG. 17 illustrates the pseudo-Schottky current I/W (μA/μm) as a function of background doping $N_B$ and gate oxide thickness. The threshold voltage $V_t$ was 0.7 V and the voltage across the diode $V_{ps}$ was 0.5 V. As indicated, the three curves are for gate oxide thicknesses of 1000 Å, 400 Å and 175 Å. While any device having a current over 0.1 μA/μm with no more than a voltage drop of 0.5 V may be useful, a target current of at least 1 μA/μm is needed for general purpose power devices. For example, a L=2 μm 20 V lateral power NMOS having an on-resistance of 300 mΩ may have a 120,000 μm channel width and would be able to handle 120 mA of current in Quadrant III without substantial PN diode current or stored charge. From FIG. 17, a 1000 Å thick gate oxide needs a background doping of $10^{16}$ cm$^{-3}$ to handle 1 μA/μm of current; a 400 Å thick gate oxide needs a doping of $4\times10^{16}$ cm$^{-3}$, and a 175 Å thick gate oxide requires $1.5\times10^{17}$ cm$^{-3}$ channel doping.

FIG. 18 illustrates the same information as a response surface where the x-axis is body doping concentration ($N_B$), the y-axis is gate oxide thickness ($X_{OX}$) and each line represents current in μA/μm scaled logarithmically from 0.1 to 1 in tenths, from 1 to 10 in unit steps. Comparing the 400 Å data of FIG. 17 at $N_B=2\times10^{16}$ cm$^{-3}$ predicts a current of 0.3 μA/μm, a value in close agreement with the measured data represented by curve PS at $V_{ds}=0.5$ V in FIG. 4B.

Figure 19:
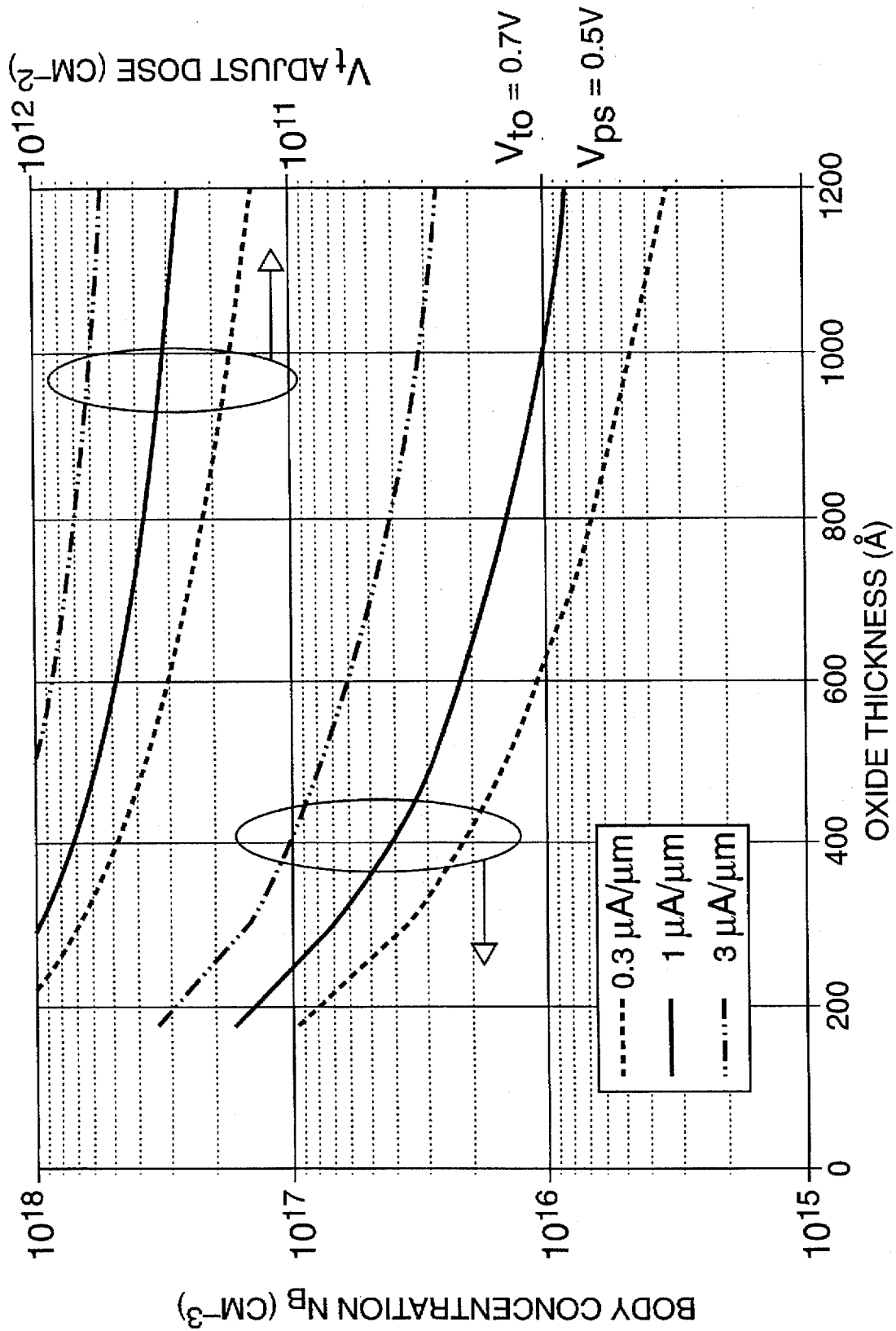
FIG. 19 illustrates a graph containing two sets of curves showing the gate oxide thickness, body doping concentration and threshold adjust dose required to achieve three different current densities in a pseudo-Schottky synchronous rectifier.

FIG. 19 summarizes the body and threshold adjust doping requirements to achieve a current density of 0.3 μA/μm, 1 μA/μm, or 3 μA/μm for a pseudo-Schottky drop in a device with a threshold voltage $V_{t0}=0.7$ V. For each oxide thickness plotted along the horizontal axis, the required body doping concentration $N_B$ and the required threshold adjust implant dose to hold $V_t=0.7$ V and $V_{PS}=0.5$ V are plotted on the lefthand and righthand vertical axes, respectively. Note that for lateral devices an increase in the body doping lowers the device breakdown. This limit is not operative in vertical DMOS devices since most of the depletion spreading occurs in the substrate (drain).

It should be noted that gate oxide thicknesses above 500 Å are not as useful for a pseudo-Schottky synchronous rectifier, such as the pseudo-Schottky synchronous rectifier 1182 shown in FIG. 11F. As indicated, above, increasing the gate oxide thickness is generally desirable in a pseudo-Schottky diode, where the gate and the body are permanently hard-wired to the source. In this situation, optimizing the current is based on obtaining the highest body effect for a low threshold voltage, and it is found that the current increases as the gate oxide becomes thicker. Because the gate drive is limited to the voltage across the device (Vps), the device is always operating in a saturated condition (or at least on the edge of saturation), and consequently one can thicken the gate oxide without much concern for the effect on other device trends.

Somewhat different criteria apply to the design of a pseudo-Schottky synchronous rectifier. As noted above, in a pseudo-Schottky synchronous rectifier the gate is not hard-wired to the source and body. Moreover, in the MOSFET mode there is generally an abundant supply of gate drive. As shown in FIG. 11F, the gate is connected to the output Vcp of the charge pump when the synchronous rectifier is turned on. In this regime, a thick gate oxide increases the on-resistance (mCoxW/L)and lowers the drain current of the MOSFET. Thus, there is a trade-off between thickening of the gate oxide, which improves the performance of the MOSFET while it is operating as a two-terminal device, and reducing the thickness of the gate oxide, which improves the performance of the device when the gate is disconnected from the source and driven more robustly by an external voltage source. Whereas a gate oxide thickness (Xox) of, for example, 400–1000 A may be ideal for a pseudo-Schottky diode, generally speaking Xox should be kept below 400 A (e.g., in the range of 175–300 A) for a pseudo-Schottky synchronous rectifier. The level of the gate drive voltage affects the trade-off to be made between a thicker or thinner gate oxide. For example, a gate drive of 3.0 V or 4.5 V argues strongly in favor of a thinner gate oxide whereas if the gate drive is only 1.2 V, a thicker gate oxide becomes more attractive.

In addition, the engineering of the drain is much more significant in the case of a pseudo-Schottky synchronous rectifier. Because the gate drive in a pseudo-Schottky diode is very weak (roughly 0.4 V), the current through the channel is very small, and drain resistance is a relatively minor consideration. Maximizing W/L is useful, but drain engineering per se is not of paramount importance. When a pseudo-Schottky synchronous rectifier is switched on into its MOSFET state, however, the drain current is sizeable and any technique reduces the drain resistance yields a significantly better device. There is a wide variety of such techniques, including increasing the drain doping, forming a delta layer in the drain of a vertical trench MOSFET (reference application Ser. No. 08/367,027, now abandoned) or a high density trench (application Ser. No. 08/533,814).

Figure 20:
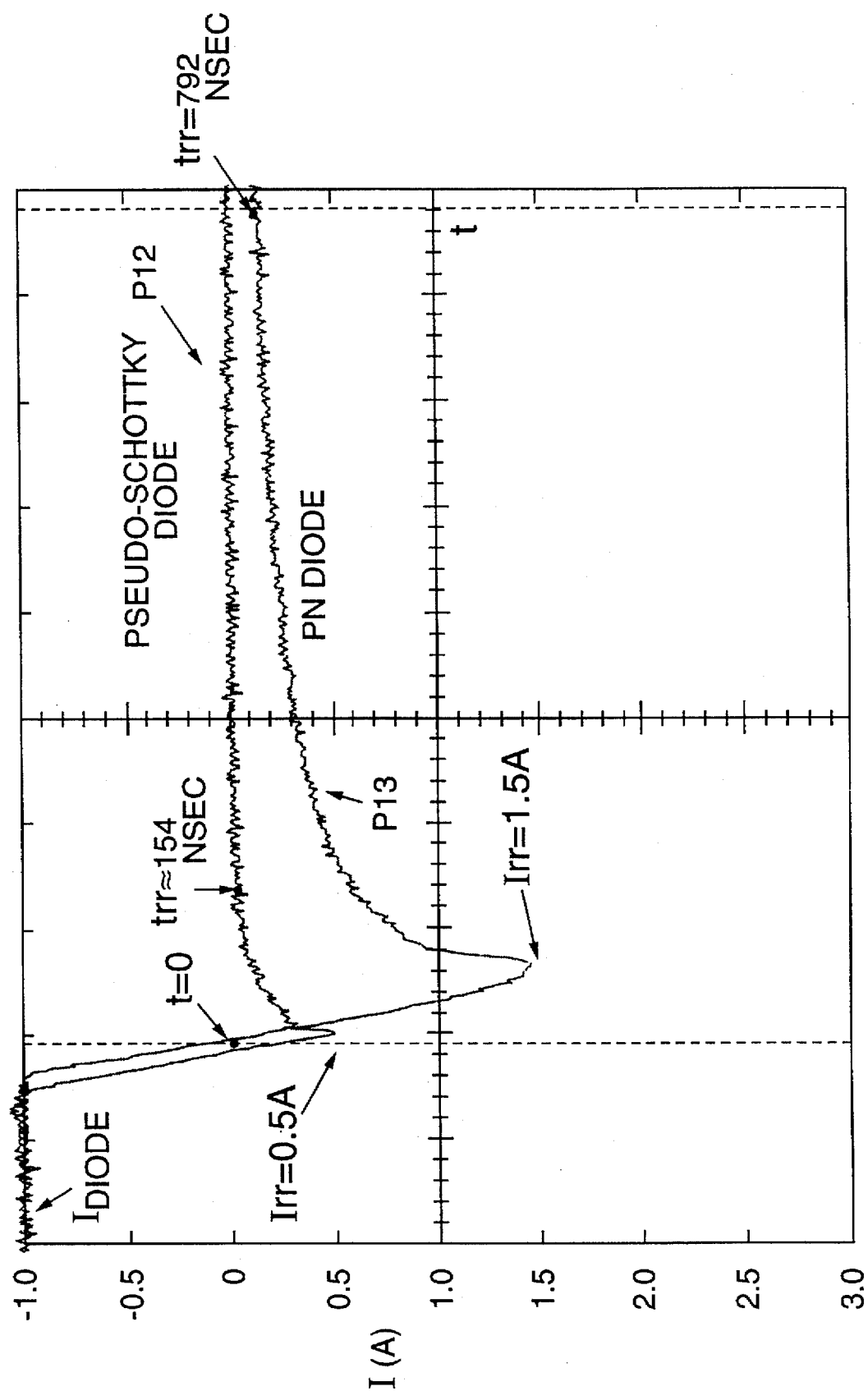
FIG. 20 illustrates a graph which compares the reverse recovery characteristics of a pseudo-Schottky synchronous rectifier with those of an ordinary P-N diode.
Figure 21:
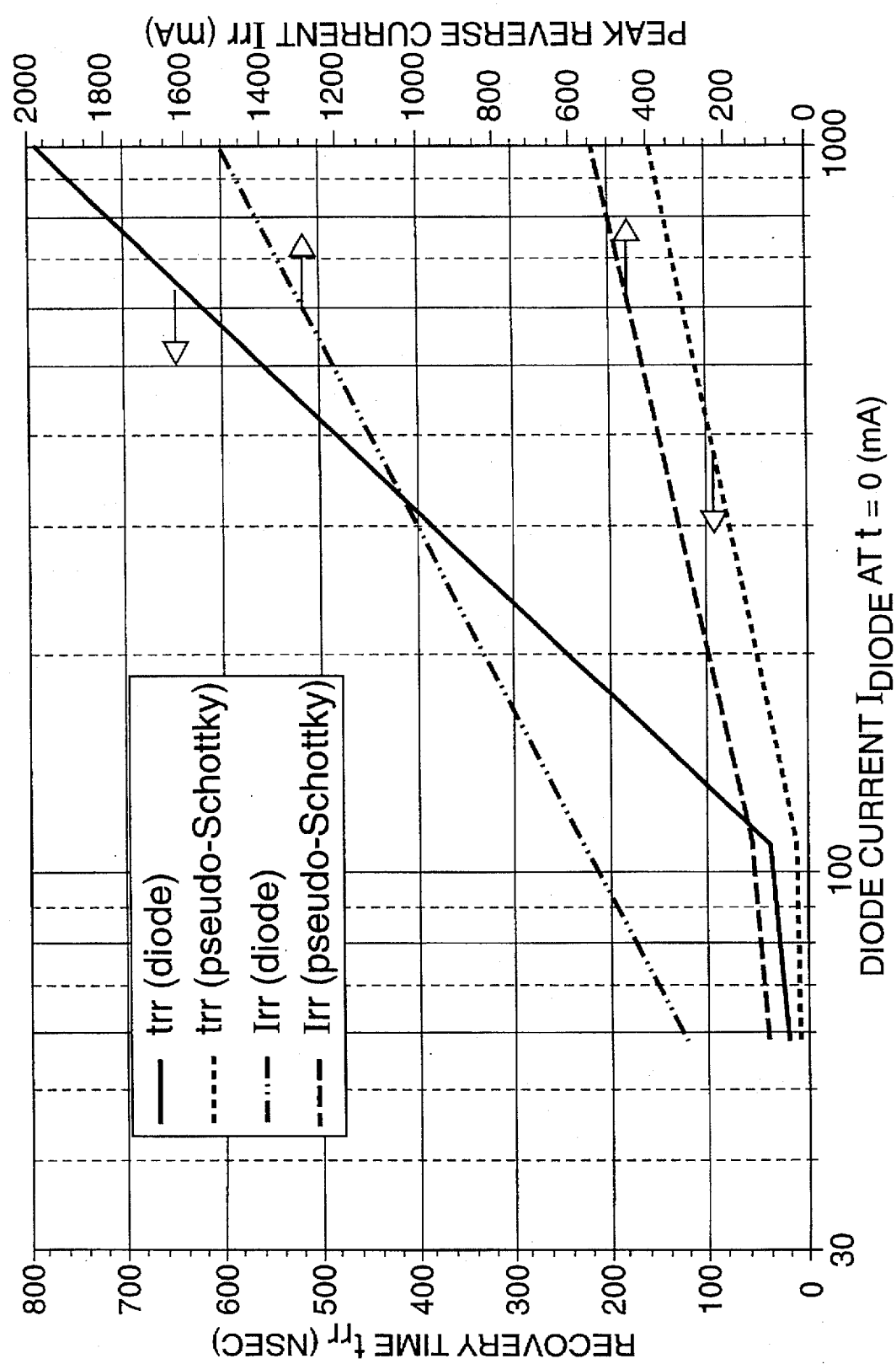
FIG. 21 illustrates a graph which compares the measured reverse recovery time and the peak reverse current of a pseudo-Schottky synchronous rectifier with those of an ordinary P-N diode.

To prove that the pseudo-Schottky diode is a majority carrier device, it was compared to the PN diode contained within the same MOSFET with the channel biased off. FIG. 20 is a plot of the measured reverse recovery time of both devices biased at a starting current of 1.0 A at t=0. Curve P12 represents the current in the pseudo-Schottky diode; curve P13 represents the current in the diode. The reverse current of the diode peaked at 1.5 A and took 792 nsec to reach 10% of its peak value, while the pseudo-Schottky diode required peaked at only 0.5 A and required only 154 nsec to reach 10% of its peak value, roughly a 3X improvement in $I_{rr}$ and a 5X improvement in $t_{rr}$. FIG. 21 is a graph of $I_{rr}$ and $t_{rr}$ for a pseudo-Schottky diode and conventional PN diode, respectively, as a function of current and illustrates that the superiority in performance of the pseudo-Schottky diode is evident over a wide range of currents. The lefthand vertical axis shows the recovery time $t_{rr}$ in nanoseconds and the righthand vertical axis shows the peak reverse current $I_{rr}$ in mA.

Figure 14A:
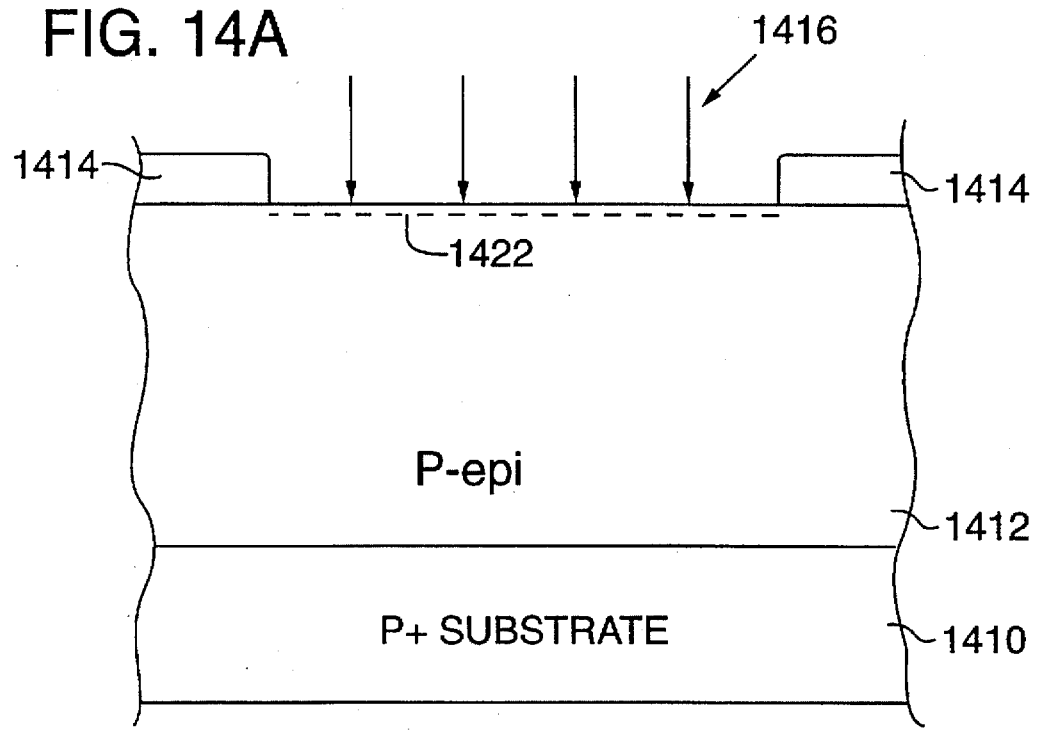
FIGS. 14A–14E illustrate cross-sectional views showing a method of forming an pseudo-Schottky synchronous rectifier based on a lateral MOSFET.

FIGS. 14A–14E show a sequence of manufacturing steps that can be used to obtain an pseudo-Schottky synchronous rectifier based on a lateral MOSFET. As shown in FIG. 14A, a P-epitaxial layer 1412, with a moderate dopant concentration (e.g., $1\times10^{15}$ to $1\times10^{18}$ cm$^{-3}$) is grown on a P+ substrate 1410. The magnitude of body doping needed to enhance the pseudo-Schottky effect is related to the gate oxide thickness. As is shown below, a 1000 Å thick gate oxide can be useful for doping concentrations over $2\times10^{15}$ cm$^{-3}$, while a gate oxide thickness of 400 Å needs a minimum doping concentration of $1.5\times10^{16}$ cm$^{-3}$. A 175 Å thick gate oxide needs a body doping concentration of at least $7\times10^{16}$ cm$^{-3}$ to be useful.

Figure 14B:
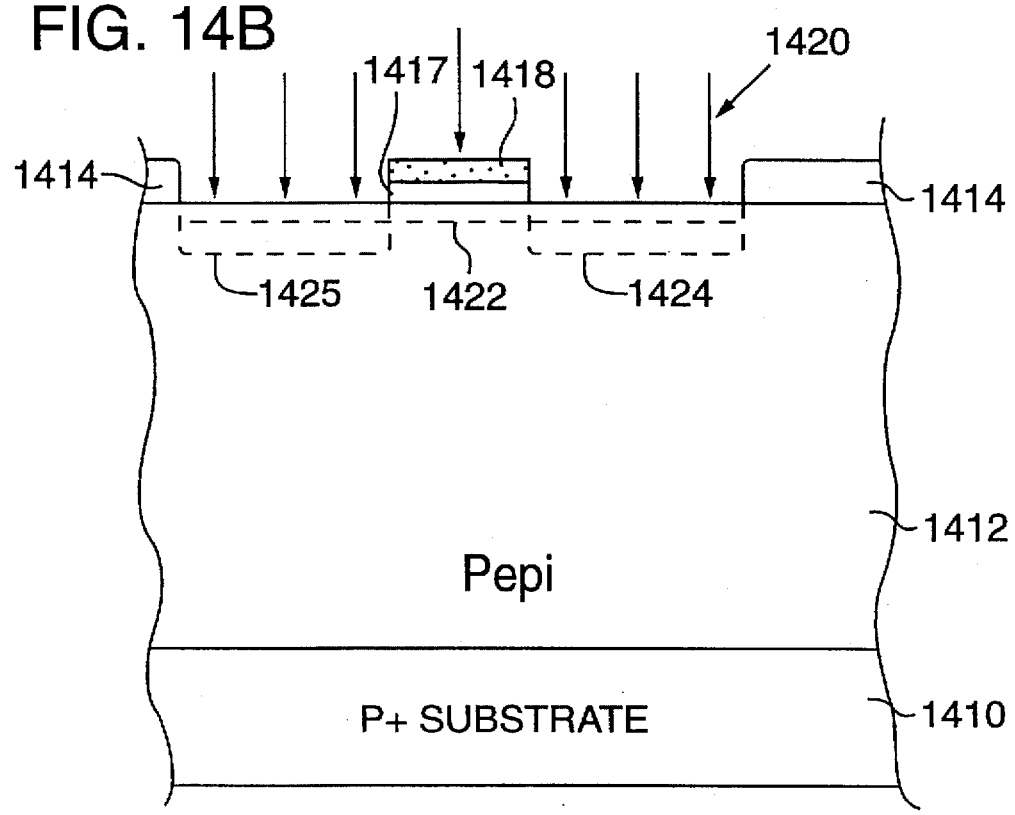

An oxide layer 1414 is used to define the active region of the device. An N-type counter dopant 1416 (phosphorous or arsenic) is implanted at the surface of P-epitaxial layer 1412, thereby forming a threshold adjust region 1422 wherein the net concentration of P-type dopant is lower than in the remainder of P-epitaxial layer 1412. In FIG. 14B, a gate oxide layer 1417 and polysilicon gate 1418 have been formed over the counter-doped threshold adjust region 1422 using conventional techniques. The thickness of gate oxide layers may range from 80 Å to 2000 Å, but it is more commonly in the range of 175 Å to 700 Å. The polysilicon gate electrode is typically 1500 Å to 6000 Å thick and is generally doped with phosphorus for an N-channel device and with boron for a P-channel device. It may be shorted by a titanium or tungsten silicide layer.

An N-type dopant 1420 (phosphorus) is implanted into the exposed portions of P-epitaxial layer 1412 to form an N-drift region 1424 and an N− region 1425. The drift implant may be omitted for 5 V or less devices having a channel length of 2 µm or less, but a side wall spacer drift on the order of 0.25 long may be needed for devices having a submicron channel length.

Figure 14C:
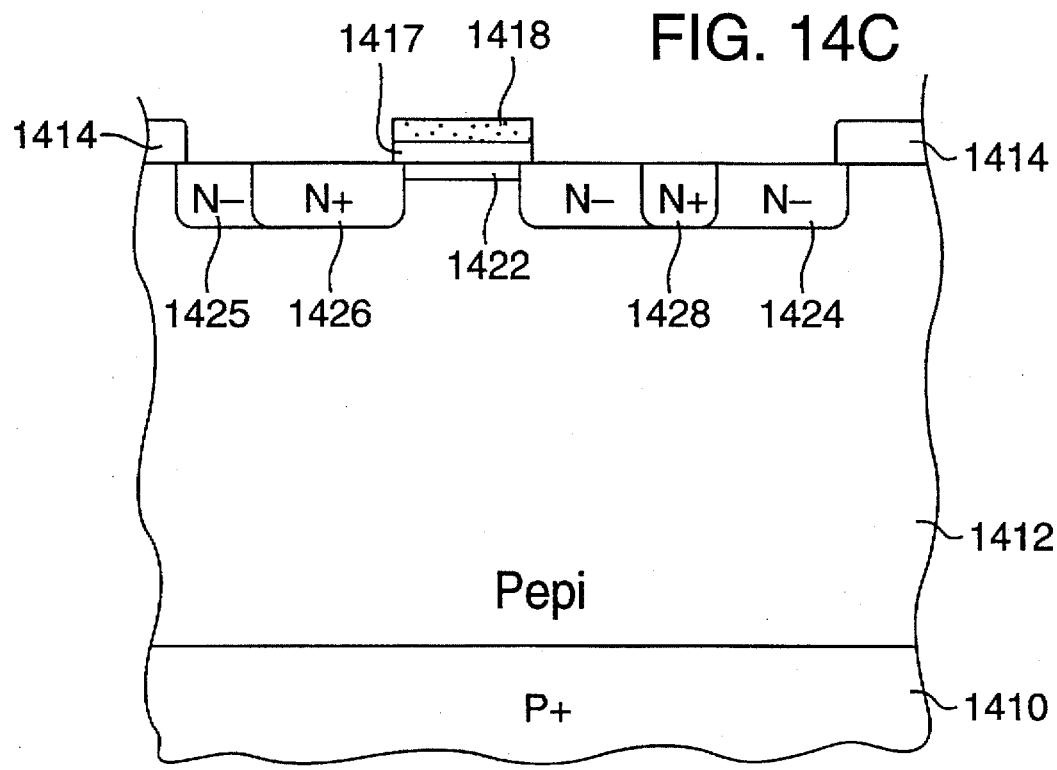
Figure 14D:
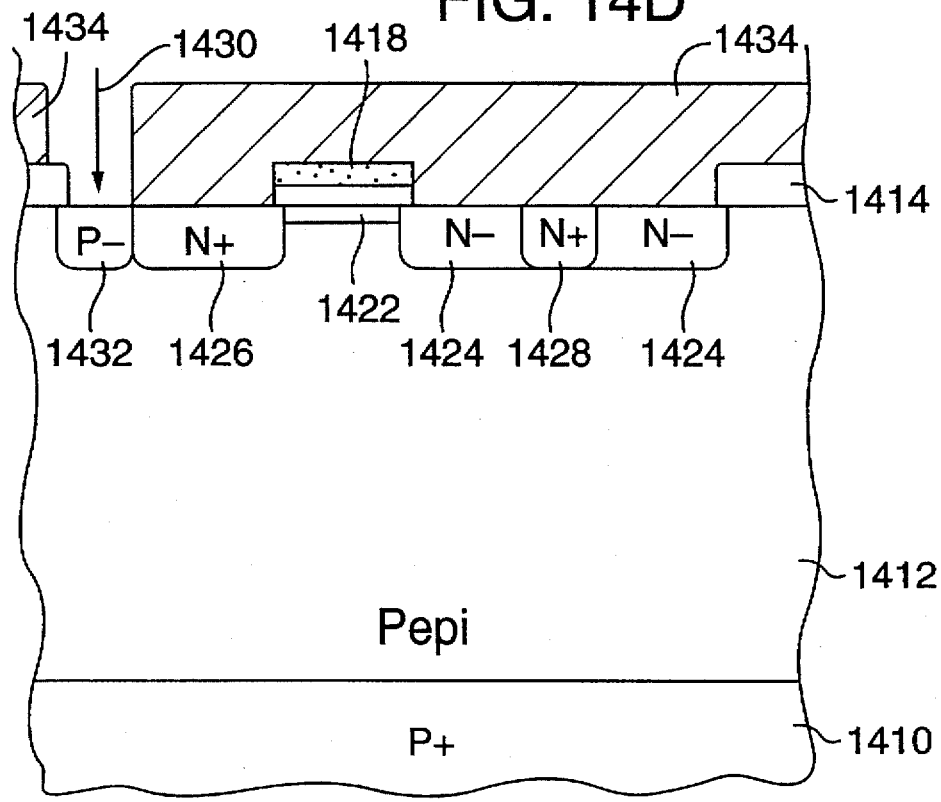
Figure 14E:
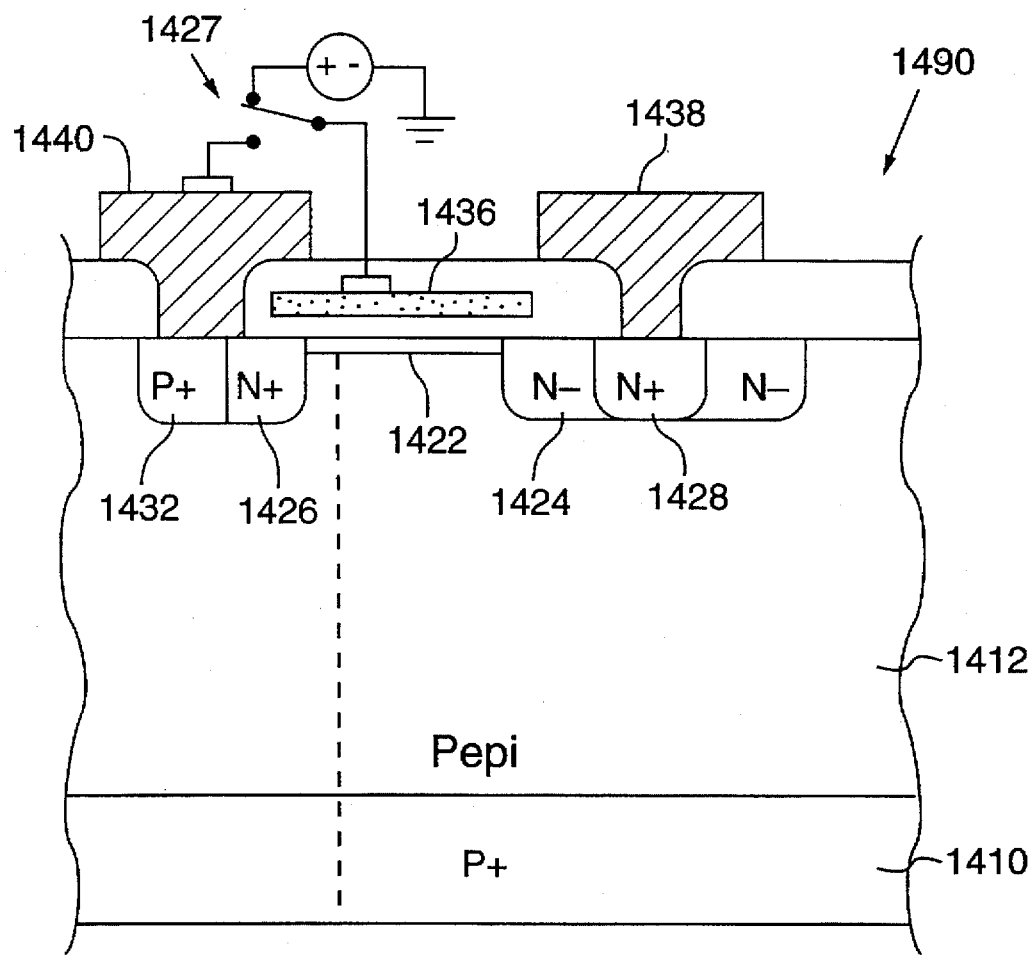

FIG. 14C shows the result of a third N-type implant, which forms an N+ source region 1426 and an N+ drain region 1428. N− region 1425 is converted into P+ body contact region 1432 in FIG. 14D by implanting a P-type dopant 1430 (boron). A photoresist layer 1434 prevents the boron implantation from reaching other areas of the device. FIG. 14E shows the resulting pseudo-Schottky synchronous rectifier 1490 after a source/body metal contact layer 1440 and a drain metal contact layer 1438 are added. The gate 1418 is electrically connected by a switch 1427 either to the source/body contact layer 1440 (when the device is in its pseudo-Schottky state) or to a source of gate drive voltage (when the device is in its MOSFET state).

Figure 14F:
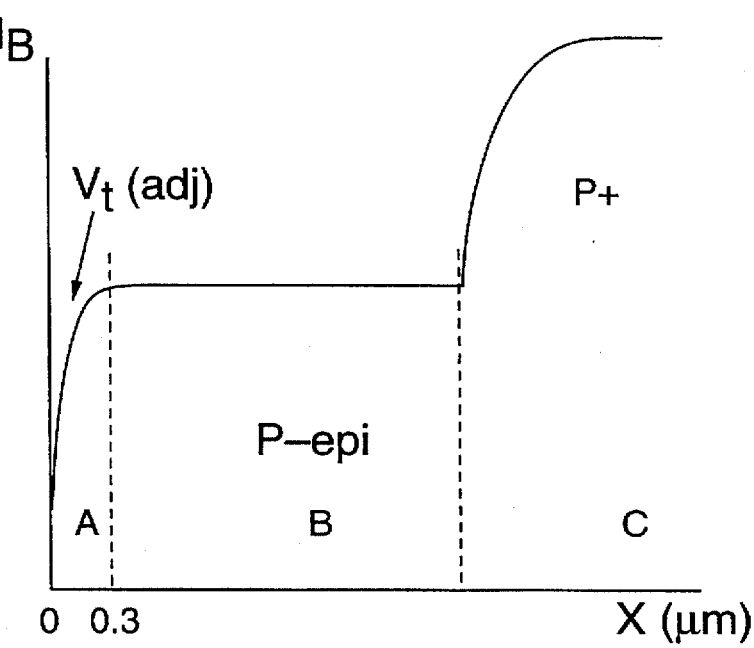
FIG. 14F illustrates a graph showing a dopant concentration profile of the pseudo-Schottky synchronous rectifier of FIG. 14E.

FIG. 14F is a graph showing the dopant concentration $N_B$ of the device taken along a vertical section through the channel of pseudo-Schottky diode 1490 (shown by the dashed line in FIG. 14E). The abscissa of the graph of FIG. 14F is the distance in µm below the surface of the threshold-adjusted channel region. Region A includes the channel, wherein the concentration of P-type dopant has been lowered by the threshold adjust implant so as to lower the threshold voltage $V_t$ and thereby improve the turn-on characteristics of pseudo-Schottky synchronous rectifier 1490. While the profile looks somewhat similar to that of a conventional threshold-adjusted MOSFET, the pseudo-Schottky effect is enhanced by unusual levels of body doping and threshold adjust counterdoping. Region B represents the P-epitaxial layer 1412, and Region C represents the P+ substrate 1410, which has the highest dopant concentration.

Pseudo-Schottky synchronous rectifier 1490 can also be manufactured without the counter-doping implant shown in FIG. 14A, if a high energy implant step, as described in application Ser. No. 07/855,373, now abandoned and application Ser. No. 07/854,162, now U.S. Pat No. 5,248,627, issued on Sep. 28, 1993 is used to drive the dopant through the polysilicon gate. The sensitivity of the device characteristics to the level of epitaxial layer doping can be reduced by performing a second ion implantation (in addition to the counterdoping threshold voltage adjust) of the same conductivity type as the epitaxial layer itself. As shown in FIG. 14G, a retrograde boron implant at a dosage in the range of $1\times10^{12}$ to $5\times10^{14}$ cm$^{-2}$ is implanted at 200 keV or greater to a mean depth of 0.2 to 1.0 µm below the surface of the epitaxial layer, so that less surface counterdoping is needed. The unimplanted portion of the P-epitaxial layer may be thin or nonexistent (the retrograde layer can extend into the substrate. The advantages of using ion implantation to set the value of $N_B$ and γ instead of using the epitaxial layer alone include improved dopant concentration control and the ability to select which MOSFETs in an IC are to be adjusted for pseudo-Schottky enhancement.

Figure 15C:
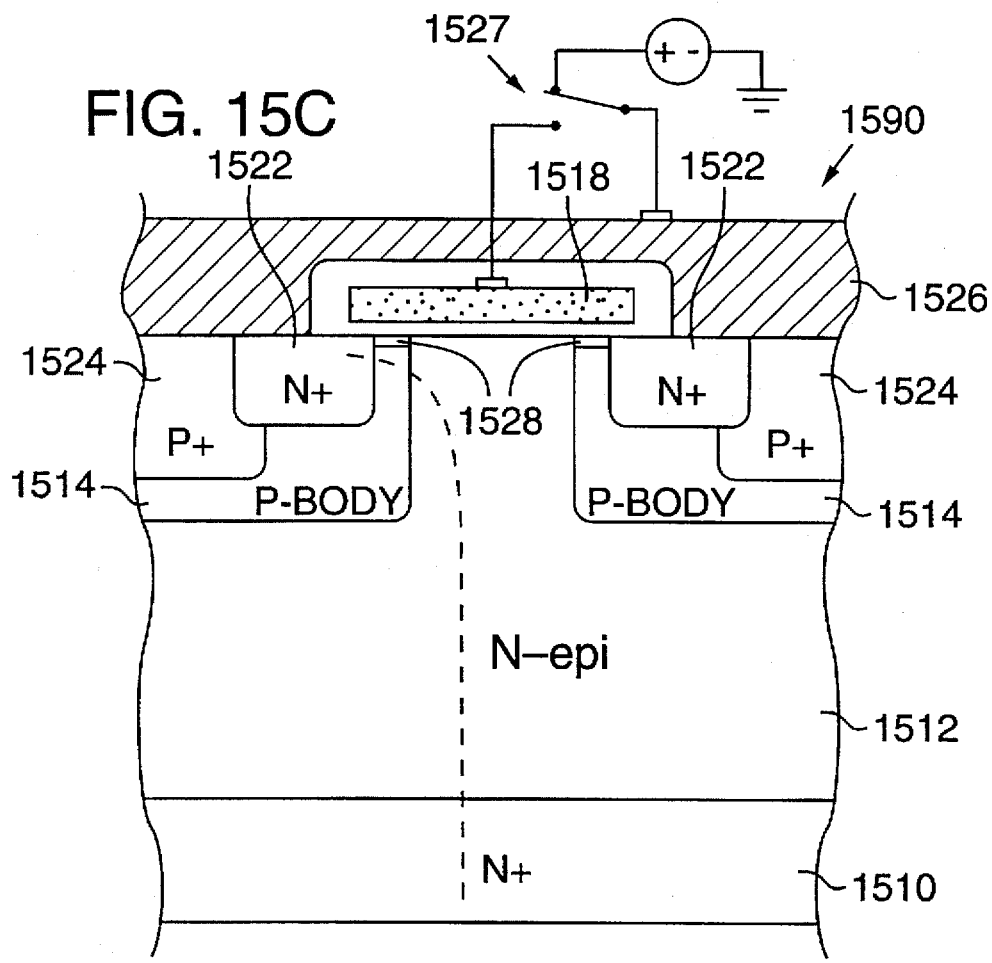

FIGS. 15A–15C show a sequence of manufacturing steps that can be used to obtain a pseudo-Schottky synchronous rectifier based on a vertical DMOSFET. As shown in FIG. 15A, an N-epitaxial layer 1512, is grown on an N+ substrate 1510 which will be the cathode of the device. The doping level of the epitaxial layer is determined by the desired breakdown voltage of the device. For high voltage devices, concentrations of $1\times10^{14}$ to $1\times10^{15}$ cm$^{-3}$ may be used while for lower voltages concentrations $1\times10^{15}$ to $1\times10^{16}$ cm$^{-3}$ may be employed. P-body regions 1514 are formed in N-epitaxial layer 1512 using conventional techniques. A gate oxide layer 1516 and a polysilicon gate 1518 are also formed using conventional techniques of implantation and drive-in.

FIG. 15B shows the addition of N+ source regions 1522 and P+ body contact regions 1524, also formed with conventional techniques. An N-type dopant 1520 (phosphorus) is then implanted at a dosage of $1\times10^{11}$ to $1\times10^{12}$ cm$^{-2}$ and an energy of 300 keV to 2 MeV through gate 1518. Dopant 1520 forms counter-doped threshold adjust regions 1528 (FIG. 15C) at the surface of P-body regions 1514 in order to adjust the threshold voltage of the device. The phosphorous dopant will have little effect on the N-epitaxial layer 1512, since it should be located near the surface. In FIG. 15C the pseudo-Schottky synchronous rectifier 1590 is substantially completed by adding a metal source/body contact layer 1526. Gate 1518 is electrically connected by a switch 1527 either to the source/body contact layer 1526 (when the device is in its pseudo-Schottky state) or to a source of gate drive voltage (when the device is in its MOSFET state).

Figure 15D:
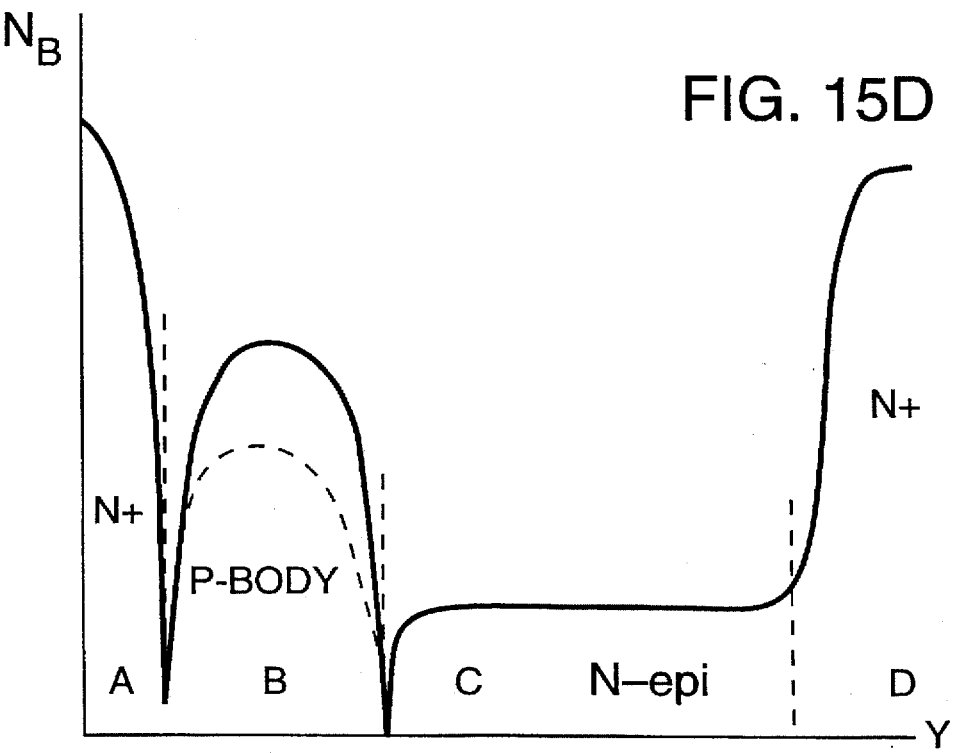
FIG. 15D illustrates a graph showing the dopant concentration profile of the pseudo-Schottky synchronous rectifier of FIG. 15C.

FIG. 15D shows the dopant concentration $N_B$ of the device at a section taken along the dashed line in FIG. 15C. In region A represents the N+ source region 1522. Region B represents P-body region 1514. The concentration near the surface of the body region, shown as a dashed line in FIG. 15D, has been lowered due to the high energy counter-doping to adjust the threshold voltage $V_t$. Region C represents N-epitaxial layer 1512, and Region D represents N+ substrate 1510.

While specific embodiments in accordance with this invention have been described, these embodiments are to be considered as illustrative and not limiting. Numerous alternative embodiments will be apparent to those skilled in the art, all of which are within the broad scope of this invention. For example, the principles of this invention are equally applicable to other MOSFET structures such as lateral DMOS and cellular MOS structures, which have cells in square, hexagonal or other shaped cells, and for either N-channel or P-channel devices.

I claim:

1. A semiconductor device comprising:

a source region of a first conductivity type;

a body region of a second conductivity type opposite to said first conductivity type adjacent said source region;

a drain region of said first conductivity type adjacent said body region, wherein said source region and said body region are connected together and biased at a first voltage and said drain region is biased at a second voltage, said first and second voltages being established such that a junction between said body region and said drain region is forward-biased;

a gate separated by an insulating layer from a channel region of said body region; and a first switch for alternately connecting said gate to said source region or to a third voltage, said third voltage being sufficient to turn said semiconductor device fully on.

2. The semiconductor device of claim 1 wherein an absolute value of said third voltage is greater than an absolute value of said first voltage.

3. A power converter comprising:

a semiconductor device comprising:

a source region of a first conductivity type;

a body region of a second conductivity type opposite to said first conductivity type adjacent said source region;

a drain region of said first conductivity type adjacent said body region, wherein said source region and said body region are connected together and biased at a first voltage and said drain region is biased at a second voltage, said first and second voltages being established such that a junction between said body region and said drain region is forward-biased;

a gate separated by an insulating layer from a channel region of said body region; and a first switch for alternately connecting said gate to said source region or to a third voltage, said third voltage being sufficient to turn said semiconductor device fully on;

said power converter further comprising:
   an inductor; and
   a second switch connected in series with said inductor;
   wherein said semiconductor device is connected to a common node between said inductor and said second switch.

4. The power converter of claim 3 further comprising a charge pump for supplying said third voltage.

5. The power converter of claim 3 wherein said first switch connects said gate to said source region during a break-before-make interval immediately after an opening of said second switch.

6. The power converter of claim 5 wherein said first switch connects said gate to said third voltage at a termination of said break-before-make interval.

7. A method of operating the power converter of claim 3 comprising the following sequence of steps:

maintaining said second switch in a closed condition while maintaining said first switch in a first position which connects said gate to said source region;

opening said second switch while maintaining said first switch in said first position; and moving said first switch to a second position so as to connect said gate to said third voltage.

8. The method of claim 7 further comprising the step of using a charge pump to supply said third voltage.

* * * * *